United States Patent

Shimamoto et al.

(10) Patent No.: US 9,472,391 B2
(45) Date of Patent: Oct. 18, 2016

(54) SEMICONDUCTOR DEVICE MANUFACTURING METHOD

(71) Applicant: HITACHI KOKUSAI ELECTRIC INC., Tokyo (JP)

(72) Inventors: Satoshi Shimamoto, Toyama (JP); Yoshiro Hirose, Toyama (JP); Atsushi Sano, Toyama (JP); Tsukasa Kamakura, Toyama (JP); Takaaki Noda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 260 days.

(21) Appl. No.: 14/230,416

(22) Filed: Mar. 31, 2014

(65) Prior Publication Data

US 2014/0349492 A1    Nov. 27, 2014

(30) Foreign Application Priority Data

May 24, 2013    (JP) .................................. 2013-110242

(51) Int. Cl.

| | | |
|---|---|---|
| C23C 16/32 | (2006.01) | |
| H01L 21/02 | (2006.01) | |
| C23C 16/40 | (2006.01) | |
| C23C 16/455 | (2006.01) | |

(52) U.S. Cl.

CPC ....... *H01L 21/02126* (2013.01); *C23C 16/401* (2013.01); *C23C 16/45534* (2013.01); *C23C 16/45536* (2013.01); *H01L 21/0228* (2013.01); *H01L 21/02211* (2013.01); *H01L 21/02274* (2013.01); *H01L 21/02321* (2013.01); *H01L 21/02337* (2013.01)

(58) Field of Classification Search

CPC ..... C23C 16/32; C23C 16/325; C23C 16/40; C23C 16/401; C23C 16/38

See application file for complete search history.

(56) References Cited

U.S. PATENT DOCUMENTS 5,958,324 A * 9/1999 Bujalski ............... C04B 35/571
264/470
6,762,435 B2 * 7/2004 Towle .................. C23C 16/401
257/76

(Continued)

FOREIGN PATENT DOCUMENTS

| CN | 104064498 A | 9/2014 |
|---|---|---|
| JP | 11-315420 | * 11/1999 |

(Continued)

OTHER PUBLICATIONS

Ivanova, Y., et al., "Si—O—C—B amorphous materials from organic-inorganic hybrid precursors". Journal of the University of Chemical Technology and Metallurgy, 41, 4, 2006, 417-422.*

(Continued)

*Primary Examiner* — Bret Chen
(74) *Attorney, Agent, or Firm* — Volpe and Koenig, P.C.

(57) ABSTRACT

A semiconductor device manufacturing method includes forming a thin film containing silicon, oxygen, carbon and a specified Group III or Group V element on a substrate by performing a cycle a predetermined number of times. The cycle includes: supplying a precursor gas containing silicon, carbon and a halogen element and having an Si—C bonding and a first catalytic gas to the substrate; supplying an oxidizing gas and a second catalytic gas to the substrate; and supplying a modifying gas containing the specified Group III or Group V element to the substrate.

17 Claims, 14 Drawing Sheets

(56) References Cited

U.S. PATENT DOCUMENTS

| | | | |
|---|---|---|---|
| 6,967,405 B1* | 11/2005 | Yu | H01L 21/76829 257/751 |
| 8,329,599 B2 | 12/2012 | Fukazawa et al. | |
| 2004/0018694 A1 | 1/2004 | Lee et al. | |
| 2007/0278681 A1* | 12/2007 | Yu | H01L 21/76807 257/758 |
| 2008/0111204 A1* | 5/2008 | Yun | H01L 27/14685 257/432 |
| 2008/0113097 A1 | 5/2008 | Mahajani et al. | |
| 2011/0256733 A1 | 10/2011 | Hirose et al. | |
| 2012/0184110 A1 | 7/2012 | Hirose et al. | |
| 2012/0220137 A1 | 8/2012 | Ota et al. | |
| 2014/0051261 A1 | 2/2014 | Ota et al. | |
| 2014/0287596 A1 | 9/2014 | Hirose et al. | |
| 2014/0342573 A1 | 11/2014 | Hirose et al. | |

FOREIGN PATENT DOCUMENTS

| | | |
|---|---|---|
| JP | 2004-040110 A | 4/2004 |
| JP | 2008-071894 A | 3/2008 |
| JP | 2008-141191 A | 6/2008 |
| JP | 2011-108737 A | 6/2011 |
| JP | 2012-160704 A | 8/2012 |
| TW | 2012-03363 A | 1/2012 |
| TW | 2012-14561 A | 4/2012 |
| TW | 2012-43950 A | 11/2012 |
| TW | 2012-50044 A | 12/2012 |
| TW | 2012-50899 A | 12/2012 |
| TW | 2013-16411 A | 4/2013 |
| WO | 2013/043330 A1 | 3/2013 |

OTHER PUBLICATIONS

Tamayo, A., et al., "Synthesis and characterization of boron silicon oxycarbide glass fibers". Journal of Non-Crystalline Solids, 358 (2012) 155-162.*

Gervais, Christel, et al., "Sol-Gel-Derived Silicon—Boron Oxycarbide Glasses Containing Mixed Silicon Oxycarbide ($SiCxO4-x$) and Boron Oxycarbide ($BCyO3-y$) Units". J. Am. Ceram. Soc., 84 [10] 2160-64 (2001).*

Schiavon, Marco Antonio, et al., "Crystallization Behavior of Novel Silicon Boron Oxycarbide Glasses". J. Am. Ceram. Soc.,87 [2] 203-208 (2004).*

Taiwanese Office Action, TW2013-16411, TW Patent Application No. 103111745, Feb. 18, 2016, 5 pages.

Japanese Office Action, JP Patent Application No. 2013-110242, Jun. 30, 2016, 3 pages (English translation attached).

Chinese Office Action, CN Patent Application No. 2014-101391178, Jun. 2, 2016, 4 pages (English translation attached).

* cited by examiner

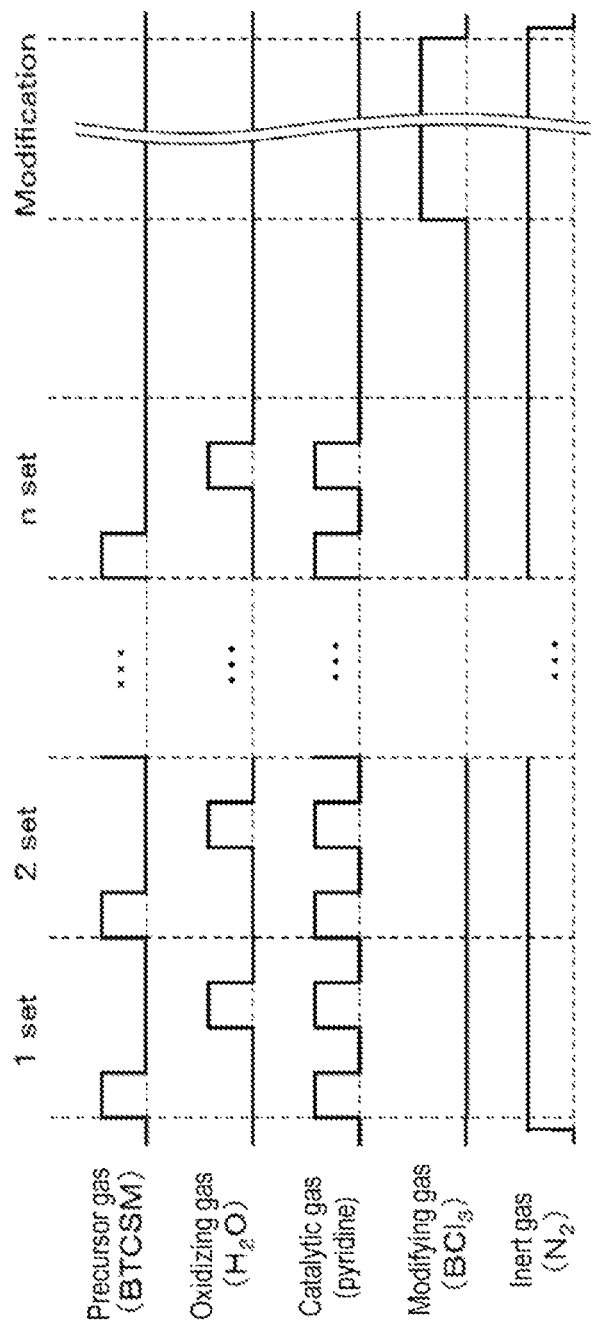

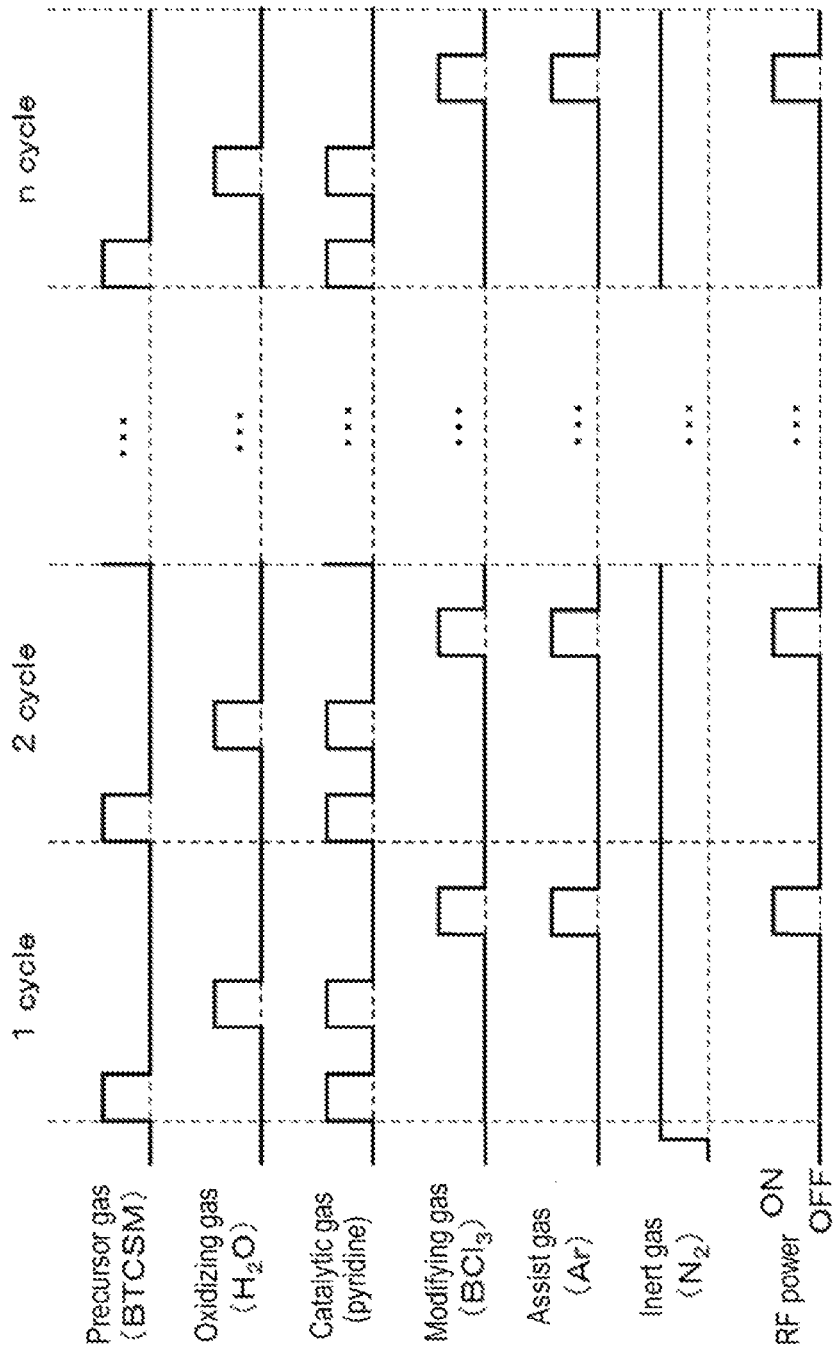

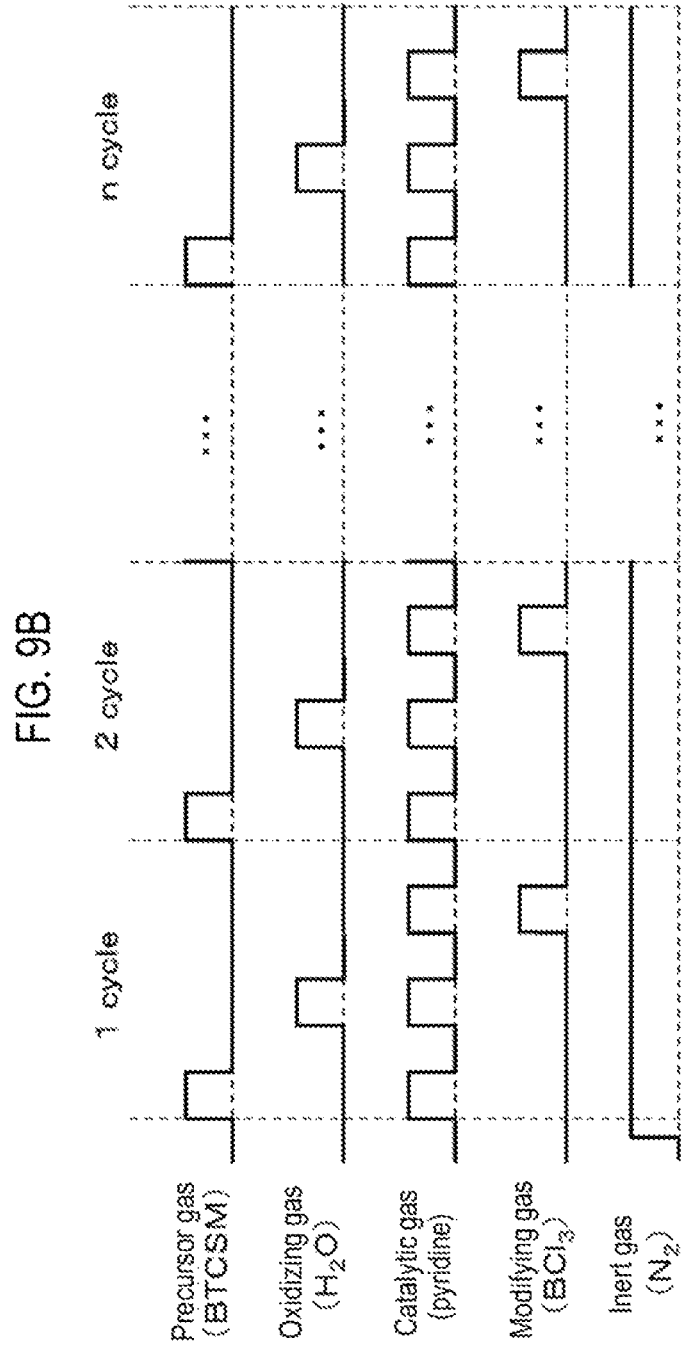

FIG. 10E

| Name | Pyridine | Aminopyridine | Picoline | Lutidine | Piperazine | Piperidine |
|---|---|---|---|---|---|---|
| Composition formula | $C_5H_5N$ | $C_5H_6N_2$ | $C_6H_7N$ | $C_7H_9N$ | $C_4H_{10}N_2$ | $C_5H_{11}N$ |
| Structural formula | | | | | | |
| Acid dissociation constant (pKa) | 5.67 | 6.89 | 6.07 | 6.96 | 9.80 | 11.12 |

SEMICONDUCTOR DEVICE MANUFACTURING METHOD

CROSS-REFERENCE TO RELATED APPLICATION

This application is based upon and claims the benefit of priority from Japanese Patent Application No. 2013-110242, filed on May 24, 2013, the entire contents of which are incorporated herein by reference.

TECHNICAL FIELD

The present disclosure relates to a semiconductor device manufacturing method, a substrate processing apparatus and a recording medium.

BACKGROUND

As one example of a manufacturing process of a semiconductor device, there is a case where a silicon oxide film is formed on a substrate by supplying, e.g., a silicon-containing precursor gas and an oxidizing gas, to the substrate. At this time, a film can be formed at a relatively low temperature by using, e.g., a catalytic gas, which improves thermal budget of a semiconductor device.

When forming the aforementioned thin film on the substrate, a film quality such as a resistance to wet etching or the like can be improved by adding, e.g., carbon, to the thin film.

However, under a condition of relatively low temperature, a sufficient amount of carbon is not introduced into the film. This often makes it difficult to obtain a thin film having a high etching resistance. Moreover, it is sometimes the case that the thin film added with carbon shows a low ashing resistance.

SUMMARY

The present disclosure provides some embodiments of a semiconductor device manufacturing method, a substrate processing apparatus and a recording medium capable of forming a thin film having a superior ashing resistance while maintaining a high etching resistance.

According to an aspect of the present disclosure, there is provided a semiconductor device manufacturing method, including: forming a thin film containing silicon, oxygen, carbon and a specified Group III or Group V element on a substrate by performing a cycle a predetermined number of times, the cycle including: supplying a precursor gas containing silicon, carbon and a halogen element and having an Si—C bonding and a first catalytic gas to the substrate; supplying an oxidizing gas and a second catalytic gas to the substrate; and supplying a modifying gas containing the specified Group III or Group V element to the substrate.

According to another aspect of the present disclosure, there is provided a substrate processing apparatus, including: a process chamber configured to accommodate therein a substrate; a precursor gas supply system configured to supply a precursor gas containing silicon, carbon and a halogen element and having an Si—C bonding into the process chamber; an oxidizing gas supply system configured to supply an oxidizing gas into the process chamber; a catalytic gas supply system configured to supply first and second catalytic gases into the process chamber; a modifying gas supply system configured to supply a modifying gas containing a specified Group III or Group V element into the process chamber; and a control unit configured to control the precursor gas supply system, the oxidizing gas supply system, the catalytic gas supply system and the modifying gas supply system such that a process of forming a thin film containing silicon, oxygen, carbon and the specified Group III or Group V element on the substrate is carried out by performing a cycle a predetermined number of times, the cycle including: supplying the precursor gas and the first catalytic gas to the substrate accommodated within the process chamber; supplying the oxidizing gas and the second catalytic gas to the substrate accommodated within the process chamber; and supplying the modifying gas to the substrate.

According to still another aspect of the present disclosure, there is provided a non-transitory computer-readable recording medium storing a program that causes a computer to perform a process of forming a thin film containing silicon, oxygen, carbon and a specified Group III or Group V element on a substrate by performing a cycle a predetermined number of times, the cycle including: supplying a precursor gas containing silicon, carbon and a halogen element and having an Si—C bonding and a first catalytic gas to the substrate accommodated within a process chamber; supplying an oxidizing gas and a second catalytic gas to the substrate accommodated within the process chamber; and supplying a modifying gas containing the specified Group III or Group V element to the substrate.

BRIEF DESCRIPTION OF THE DRAWINGS

FIG. 5A is a view showing gas supply timings in the film-forming sequence of the first embodiment of the present disclosure.

FIGS. 6A and 6B are explanatory views of catalyst action in a thin film forming process of the first embodiment of the present disclosure, FIG. 6A being a view explaining Step 1a and FIG. 6B being a view explaining Step 2a.

FIG. 9A is a view showing gas supply timings and a RF power supply timing in the film-forming sequence of the second embodiment of the present disclosure, and FIG. 9B is a view showing a modified example thereof.

FIG. 10E is a view showing the names, chemical composition formulae, chemical structural formulae and acid dissociation constants of a variety of amines used as a catalytic gas.

DETAILED DESCRIPTION

Reference will now be made in detail to various embodiments, examples of which are illustrated in the accompanying drawings. In the following detailed description, numerous specific details are set forth in order to provide a thorough understanding of the present disclosure(s). However, it will be apparent to one of ordinary skill in the art that the present disclosure(s) may be practiced without these specific details. In other instances, well-known methods, procedures, systems, and components have not been described in detail so as not to unnecessarily obscure aspects of the various embodiments.

First Embodiment

A first embodiment of the present disclosure will now be described with reference to the drawings.

(1) OVERALL CONFIGURATION OF SUBSTRATE PROCESSING APPARATUS

Figure 1:
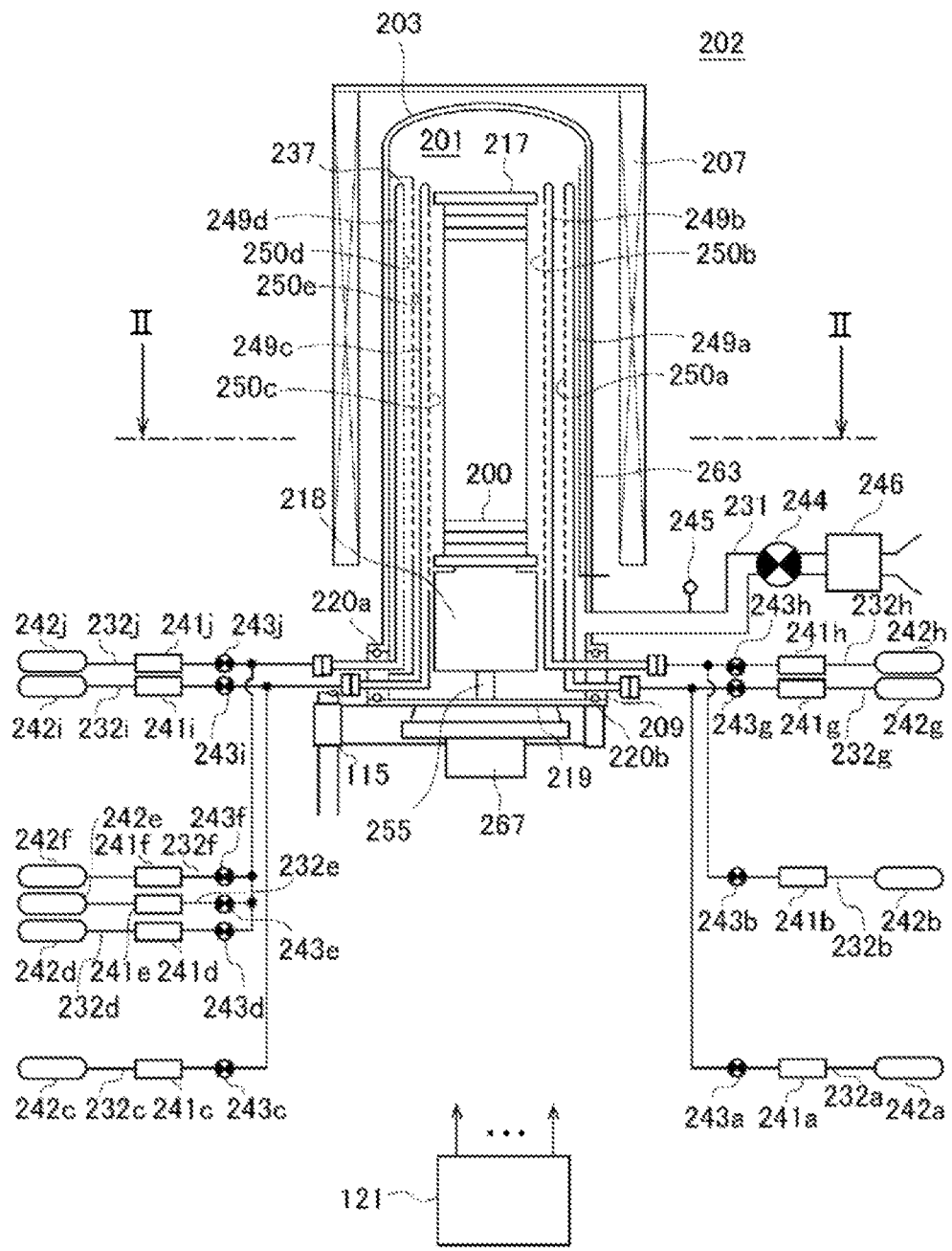
FIG. 1 is a schematic configuration view of a vertical processing furnace for a substrate processing apparatus appropriately used in a first embodiment of the present disclosure, showing the processing furnace in a vertical sectional view.

As shown in FIG. 1, a processing furnace 202 includes a heater 207 as a heating unit (heating mechanism). The heater 207 has a cylindrical shape and is supported by a heater base (not shown) as a support plate so as to be vertically installed. The heater 207 also acts as an activating mechanism (exciting unit) to activate (excite) gas by heat, as described later.

A reaction tube 203 is disposed inside the heater 207 to be concentric with the heater 207. The reaction tube 203 is made of a heat resistant material such as quartz ($SiO_2$) or silicon carbide (SiC), and has a cylindrical shape with its upper end closed and its lower end opened. A manifold (inlet flange) 209 is disposed below the reaction tube 203 concentric with the reaction tube 203. The manifold 209 is made of, for example, metal such as stainless steel, and is formed in a cylindrical shape with its upper and lower end portions opened. The upper end portion of the manifold 209 engages with the lower end portion of the reaction tube 203 and is configured to support the reaction tube 203. An O-ring 220a as a seal member is installed between the manifold 209 and the reaction tube 203. The manifold 209 is supported on the heater base, whereby the reaction tube 203 is in a vertical installation state. A process vessel (reaction vessel) mainly includes the reaction tube 203 and the manifold 209. A process chamber 201 is defined in a hollow cylindrical portion of the process vessel. The process chamber 201 is configured to accommodate a plurality of wafers 200 as substrates. The wafers 200 are horizontally stacked in multiple stages and are aligned in a vertical direction in a boat 217 described later.

Nozzles 249a to 249d are installed within the process chamber 201 so as to penetrate a sidewall of the manifold 209. Gas supply pipes 232a to 232d are connected to the nozzles 249a to 249d, respectively. Gas supply pipes 232e and 232f are connected to the gas supply pipe 232d. In this way, four nozzles 249a to 249d and a plurality of gas supply pipes 232a to 232f are installed in the reaction tube 203 and are configured to supply a plurality of different types of gases into the process chamber 201.

An $(SiCl_3)_2CH_2$(BTCSM) gas supply source 242a serving as, e.g., a precursor gas supply source, is connected to the upstream end of the gas supply pipe 232a. An $H_2O$ gas supply source 242b serving as, e.g., an oxidizing gas supply source, is connected to the upstream end of the gas supply pipe 232b. A $C_5H_5N$ (pyridine) gas supply source 242c serving as, e.g., a catalytic gas supply source, is connected to the upstream end of the gas supply pipe 232c. $N_2$ gas supply sources 242g to 242i serving as, e.g., inert gas supply sources, are connected to the upstream ends of gas supply pipes 232g to 232i respectively connected to the gas supply pipes 232a to 232c. MFCs (Mass Flow Controllers) 241a to 241c and 241g to 241i as flow rate controllers (flow rate control parts) and valves 243a to 243c and 243g to 243i as opening/closing valves are respectively installed in the gas supply pipes 232a to 232c and 232g to 232i in the named order from the upstream ends of the gas supply pipes 232a to 232c and 232g to 232i to which the respective gas supply sources 242a to 242c and 242g to 242i are connected. The downstream ends of the gas supply pipes 232g to 232i are respectively connected to the gas supply pipes 232a to 232c at the downstream side of the valves 243a to 243c.

Figure 2:
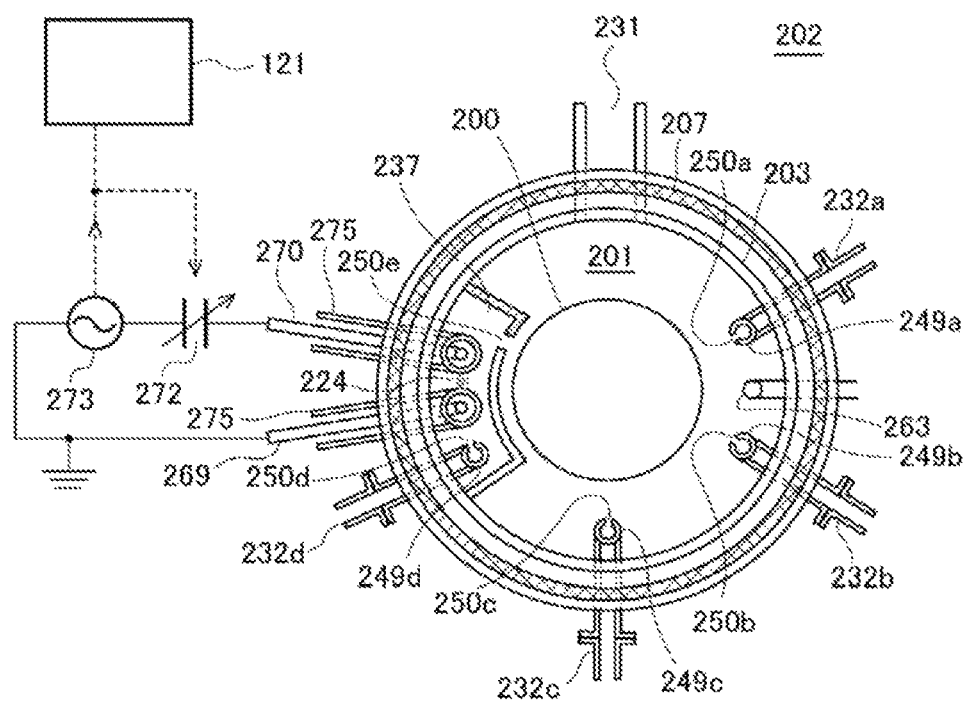
FIG. 2 is a schematic configuration view of the vertical processing furnace for a substrate processing apparatus appropriately used in the first embodiment of the present disclosure, showing the processing furnace in a sectional view taken along line II-II in FIG. 1.

The nozzles 249a to 249c are respectively connected to the tip end portions of the gas supply pipes 232a to 232c. As shown in FIG. 2, the nozzles 249a to 249c are installed in an annular space between the inner wall of the reaction tube 203 and the wafers 200 so as to extend upward in the stacking direction of the wafers 200 from the lower portion of the inner wall of the reaction tube 203 to the upper portion thereof. In other words, the nozzles 249a to 249c are respectively installed in a region which exists at the lateral side of a wafer arrangement region where the wafers 200 are arranged and which horizontally surrounds the wafer arrangement region, so that the nozzles 249a to 249c can extend along the wafer arrangement region. Each of the nozzles 249a to 249c is configured by an L-shaped long nozzle. Each of the nozzles 249a to 249c includes a horizontal portion which is installed so as to penetrate the side wall of the manifold 209 and a vertical portion which is installed to extend upward at least from one end portion of the wafer arrangement region toward the other end portion thereof. Gas supply holes 250a to 250c for supplying gases therethrough are respectively formed on the side surfaces of the nozzles 249a to 249c. As shown in FIG. 2, the gas supply holes 250a to 250c are opened toward the center of the reaction tube 203 so that gases can be supplied toward the wafers 200. The plurality of gas supply holes 250a to 250c is disposed at a predetermined opening pitch from a lower portion to an upper portion of the reaction tube 203. Each of the plurality of gas supply holes 250a to 250c has the same opening area.

A $BCl_3$ gas supply source 242d serving as, e.g., a modifying gas supply source, is connected to the upstream end of the gas supply pipe 232d. A $PH_3$ gas supply source 242e serving as, e.g., a modifying gas supply source, is connected to the upstream end of the gas supply pipe 232e. An Ar gas supply source 242f serving as, e.g., an assist gas supply source for supplying a gas which assists in igniting plasma, is connected to the upstream end of the gas supply pipe 232f. An $N_2$ gas supply source 242j serving as, e.g., an inert gas supply source, is connected to the upstream end of the gas supply pipe 232j connected to the gas supply pipe 232d. MFCs 241d to 241f and 241j as flow rate controllers (flow rate control parts) and valves 243d to 243f and 243j as opening/closing valves are respectively installed in the gas supply pipes 232*d* to 232*f* and 232*j* in the named order from the upstream ends of the gas supply pipes 232*d* to 232*f* and 232*j* to which the respective gas supply sources 242*d* to 242*f* and 242*j* are connected. The downstream ends of the gas supply pipes 232*e* and 232*f* and the downstream end of the gas supply pipe 232*j* are connected to the gas supply pipe 232*d* at the downstream side of the valve 243*d*.

The nozzle 249*d* is connected to the tip end portion of the gas supply pipe 232*d*. The nozzle 249*d* is installed within a buffer chamber 237 which is a gas diffusion space. As shown in FIG. 2, the buffer chamber 237 is installed in an annular space between the inner wall of the reaction tube 203 and the wafers 200 and is disposed from the bottom to the top along the inner wall of the reaction tube 203 in the stacking direction of the wafers 200. That is, the buffer chamber 237 is installed in a region existing at the lateral side of the wafer arrangement region and horizontally surrounding the wafer arrangement region, so as to extend along the wafer arrangement region. Gas supply holes 250*e* for supplying a gas therethrough are formed in an end portion of a wall of the buffer chamber 237 adjoining the wafers 200. The gas supply holes 250*e* are opened toward the center of the reaction tube 203 so that a gas can be supplied toward the wafers 200. The plurality of gas supply holes 250*e* is disposed at a predetermined opening pitch from a lower portion to an upper portion of the reaction tube 203. Each of the plurality of gas supply holes 250*e* has the same opening area.

As shown in FIG. 2, the nozzle 249*d* is installed in an end portion of the buffer chamber 237 opposite to the end portion in which the gas supply holes 250*e* are formed, such that the nozzle 249*d* extends upward in the stacking direction of the wafers 200 from the lower portion of the inner wall of the reaction tube 203 to the upper portion thereof. That is to say, the nozzle 249*d* is installed in a region which exists at the lateral side of the wafer arrangement region where the wafers 200 are arranged and which horizontally surrounds the wafer arrangement region, so as to extend along the wafer arrangement region. The nozzle 249*d* is configured by an L-shaped long nozzle. The nozzle 249*d* includes a horizontal portion installed to penetrate the sidewall of the manifold 209 and a vertical portion installed to extend at least from one end portion of the wafer arrangement region toward the other end portion thereof. Gas supply holes 250*d* for supplying a gas therethrough are formed on the side surface of the nozzle 249*d*. As shown in FIG. 2, the gas supply holes 250*d* are opened toward the center of the buffer chamber 237. As with the gas supply holes 250*e* of the buffer chamber 237, a plurality of gas supply holes 250*d* are formed from the lower portion of the reaction tube 203 to the upper portion thereof. If a differential pressure between an internal pressure of the buffer chamber 237 and an internal pressure of the process chamber 201 is small, the respective gas supply holes 250*d* may have the same opening area and the same pitch from the upstream side (the lower portion) to the downstream side (the upper portion). However, if the differential pressure is large, the opening area may be increased or the opening pitch may be decreased from the upstream side toward the downstream side.

In the present embodiment, the opening area or the opening pitch of the respective gas supply holes 250*d* is adjusted from the upstream side toward the downstream side in the aforementioned manner, whereby a gas is first ejected from the respective gas supply holes 250*d* at different flow velocities but at a substantially equal flow rate. Then, the gas ejected from the respective gas supply holes 250*d* is first introduced into the buffer chamber 237 where the different flow velocities of the gas are made uniform. That is to say, the particle velocities of the gas ejected from the respective gas supply holes 250*d* into the buffer chamber 237 are reduced within the buffer chamber 237. Thereafter, the gas is ejected from the gas supply holes 250*e* into the process chamber 201. Thus, the gas ejected from the respective gas supply holes 250*d* into the buffer chamber 237 becomes a gas having a uniform flow rate and a uniform flow velocity when it is ejected from the gas supply holes 250*e* into the process chamber 201.

In the gas supply method of the present embodiment which makes use of long nozzles, gases are transferred via the nozzles 249*a* to 249*d* and the buffer chamber 237 disposed within the vertically-extending annular space, namely the cylindrical space, defined by the inner wall of the reaction tube 203 and the end portions of the stacked wafers 200. The gases are initially ejected from the gas supply holes 250*a* to 250*e*, which are formed in the nozzles 249*a* to 249*d* and the buffer chamber 237, into the reaction tube 203 in the vicinity of the wafers 200. Thus, the main flows of the gases within the reaction tube 203 are oriented in a direction parallel to the surfaces of the wafers 200, i.e., in the horizontal direction. With this configuration, the gases can be uniformly supplied to the respective wafers 200 and, therefore, the thickness of a film formed on the surface of each of the wafers 200 can be made uniform. In addition, the gases flowing on the surfaces of the wafers 200, i.e., the residual gases remaining after a reaction, flow toward an exhaust port, i.e., an exhaust pipe 231 described later. The flow direction of the residual gases is not limited to the vertical direction but is appropriately decided depending on the position of the exhaust port.

A precursor gas containing silicon (Si), carbon (C) and an halogen element (such as fluorine (F), chlorine (Cl) or bromine (Br)) and having an Si—C bonding, for instance, a chlorosilane-based precursor gas including a methylene group, which is a precursor gas containing Si, a methylene group as an alkylene group and a chloro group as a halogen group, is supplied from the gas supply pipe 232*a* into the process chamber 201 through the MFC 241*a*, the valve 243*a* and the nozzle 249*a*. The chlorosilane-based precursor gas including a methylene group refers to a silane-based precursor gas including a methylene group and a chloro group. The chlorosilane-based precursor gas is a precursor gas which includes at least Si, a methylene group containing C, and Cl as a halogen element. As the chlorosilane-based precursor gas including a methylene group, which is supplied from the gas supply pipe 232*a*, it is possible to use, e.g., a methylene bis(trichlorosilane) gas, namely a bis(trichlorosilyl)methane [$(SiCl_3)_2CH_2$, abbreviation: BTCSM] gas.

Figure 10A:
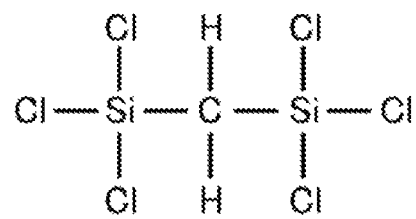
FIGS. 10A to 10D are views of chemical structural formulae of a variety of silanes used as a precursor gas, showing chemical structural formulae of BTCSM, BTCSE, TCDMDS and DCTMDS, respectively.

As shown in FIG. 10A, BTCSM includes a methylene group as an alkylene group in the chemical structural formula (one molecule) thereof. In the methylene group included in BTCSM, two bonding electrons are bonded to Si, thereby forming an Si—C—Si bonding. The Si—C bonding of the precursor gas is, e.g., a portion of the Si—C—Si bonding included in BTCSM. The methylene group included in BTCSM includes C that constitutes the Si—C bonding.

The precursor gas containing Si, C and a halogen element and having an Si—C bonding includes, e.g., a chlorosilane-based precursor gas including an ethylene group, which is a precursor gas including an ethylene group as an alkylene group and a chloro group as a halogen group. As the chlorosilane-based precursor gas including an ethylene group, it is possible to use, e.g., an ethylene bis(trichlorosilane) gas, namely a 1,2-bis(trichlorosilyl)ethane [$(SiCl_3)_2C_2H_4$, abbreviation: BTCSE] gas.

Figure 10B:
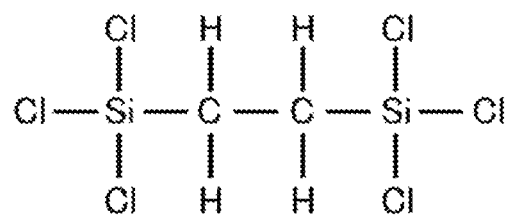

As shown in FIG. 10B, BTCSE includes an ethylene group as an alkylene group in the chemical structural formula (one molecule) thereof. In the ethylene group included in BTCSE, two bonding electrons are bonded to Si, thereby forming an Si—C—C—Si bonding. The Si—C bonding of the precursor gas is, e.g., a portion of the Si—C—C—Si bonding included in BTCSE. The ethylene group included in BTCSE includes C that constitutes the Si—C bonding.

The alkylene group is a functional group obtained by removing two hydrogen (H) atoms from chain-like saturated hydrocarbon (alkane) represented by a general formula $C_nH_{2n+2}$, and is an aggregate of atoms represented by a general formula $C_nH_{2n}$. The alkylene group includes not only the methylene group and the ethylene group mentioned above but also a propylene group, a butylene group and so forth. As mentioned above, the precursor gas containing Si, C and a halogen element and having an Si—C bonding includes an alkylenehalosilane-based precursor gas containing Si, an alkylene group and a halogen element. The alkylenehalosilane-based precursor gas is a halosilane-based precursor gas including an alkylene group. It can be said that the alkylenehalosilane-based precursor gas is a gas having a structure in which an alkylene group is introduced between, e.g., Si—Si bonding, while maintaining a state in which many halogen elements are bonded to bonding electrons of Si of the halosilane-based precursor gas. The alkylenehalosilane-based precursor gas includes a BTCSM gas, a BTCSE gas, and so forth.

The precursor gas containing Si, C and a halogen element and having an Si—C bonding further includes, e.g., a chlorosilane-based precursor gas including a methyl group, which is a precursor gas including a methyl group as an alkyl group and a chloro group as a halogen group. The chlorosilane-based precursor gas including a methyl group is a silane-based gas including a methyl group and a chloro group, and is a precursor gas including at least Si, a methyl group containing C, and Cl as a halogen element As the chlorosilane-based precursor gas including a methyl group, it is possible to use, e.g., a 1,1,2,2-tetrachloro-1,2-dimethyldisilane [$(CH_3)_2Si_2Cl_4$, abbreviation: TCDMDS] gas, a 1,2-dichloro-1,1,2,2-tetramethyldisilane [$(CH_3)_4Si_2Cl_2$, abbreviation: DCTMDS] gas, a 1-monochloro-1,1,2,2,2-pentamethyldisilane [$(CH_3)_5Si_2Cl$, abbreviation: MCPMDS], and so forth.

Figure 10C:
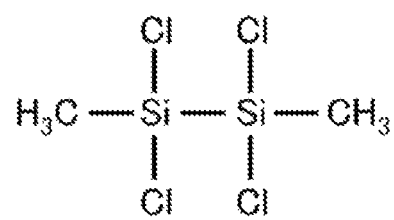

As shown in FIG. 10C, TCDMDS includes two methyl groups as alkyl groups in the chemical structural formula (one molecule) thereof. In the two methyl groups included in TCDMDS, individual bonding electrons are respectively bonded to Si, thereby forming an Si—C bonding. The Si—C bonding of the precursor gas is, e.g., an Si—C bonding included in TCDMDS. Each of the two methyl groups included in TCDMDS includes C that constitutes the Si—C bonding.

Figure 10D:
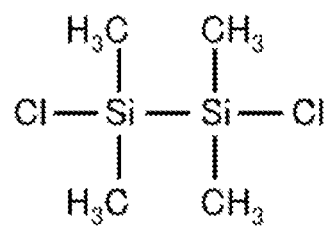

As shown in FIG. 10D, DCTMDS includes four methyl groups as alkyl groups in the chemical structural formula (one molecule) thereof. In the four methyl groups included in DCTMDS, individual bonding electrons are respectively bonded to Si, thereby forming an Si—C bonding. The Si—C bonding of the precursor gas is, e.g., an Si—C bonding included in DCTMDS. Each of the four methyl groups included in DCTMDS includes C that constitutes the Si—C bonding.

The alkyl group is a functional group obtained by removing one H atom from chain-like saturated hydrocarbon (alkane) represented by a general formula $C_nH_{2n+2}$, and is an aggregate of atoms represented by a general formula $C_nH_{2n+1}$. The alkyl group includes not only the methyl group mentioned above but also an ethyl group, a propyl group, a butyl group and so forth. As mentioned above, the precursor gas containing Si, C and a halogen element and having an Si—C bonding includes an alkylhalosilane-based precursor gas containing Si, an alkyl group and a halogen element. The alkylhalosilane-based precursor gas is a halosilane-based precursor gas including an alkyl group. It can be said that the alkylhalosilane-based precursor gas is a gas having a structure in which a halogen group as a portion of the halosilane-based precursor gas is substituted by an alkyl group. The alkylhalosilane-based precursor gas includes a TCDMDS gas, a DCTMDS gas, an MCPMDS gas, and so forth.

It can be said that the BTCSM gas, the BTCSE gas, the TCDMDS gas, the DCTMDS gas or the MCPMDS gas is a precursor gas containing C, a halogen element (Cl) and at least two Si in one molecule and having an Si—C bonding. By using the precursor gases of these types, as described later, it becomes possible to introduce C into a thin film at a high concentration.

The precursor gas refers to a gas phase precursor, e.g., a gas obtained by vaporizing a precursor kept in a liquid phase under a normal temperature and a normal pressure, or a precursor kept in a gas phase under a normal temperature and a normal pressure. It is sometimes the case that the term "precursor" used herein means a "liquid precursor kept in a liquid phase", a "precursor gas kept in a gas phase", or both. Accordingly, it is sometimes the case that the term "halosilane-based precursor (chlorosilane-based precursor)" used herein means a "halosilane-based precursor (chlorosilane-based precursor) kept in a liquid phase", a "halosilane-based precursor gas (chlorosilane-based precursor gas) kept in a gas phase", or both. In the case of using a liquid precursor kept in a liquid phase under a normal temperature and a normal pressure, such as BTCSM, BTCSE, TCDMDS, DCTMDS, MCPMDS or the like, the liquid precursor is vaporized by a vaporizing system such as a vaporizer or a bubbler and is supplied as a precursor gas (a BTCSM gas, a BTCSE gas, a TCDMDS gas, a DCTMDS gas or an MCPMDS gas).

An oxidizing gas, e.g., a gas containing oxygen (O) (an oxygen-containing gas), is supplied from the gas supply pipe 232b into the process chamber 201 through the MFC 241b, the valve 243b and the nozzle 249b. As the oxidizing gas supplied from the gas supply pipe 232b, it is possible to use, e.g., water vapor (an $H_2O$ gas). When supplying the $H_2O$ gas, it may be possible to employ a configuration in which an oxygen ($O_2$) gas and a hydrogen ($H_2$) gas are supplied to an external combustion device not shown, thereby generating and supplying an $H_2O$ gas.

A catalytic gas whose acid dissociation constant (hereinafter also referred to as pKa) is about 5 to 11, in some embodiments, 5 to 7, e.g., a gas containing nitrogen (N) having lone pair of electrons, is supplied from the gas supply pipe 232c into the process chamber 201 through the MFC 241c, the valve 243c and the nozzle 249c. The term "acid dissociation constant (pKa)" used herein is an index that quantitatively indicates the intensity of an acid. The acid dissociation constant (pKa) indicates the equilibrium constant Ka in a dissociation reaction in which hydrogen ions are emitted from an acid, in terms of a negative common logarithm. Since the catalytic gas includes N having a lone pair of electrons, the catalytic action thereof weakens a bonding force of O—H bonding present on a surface of the wafer 200 or in an oxidizing gas such as an $H_2O$ gas or the like, consequently accelerating the decomposition of a precursor gas or a modifying gas to be described later and accelerating an oxidation reaction caused by an $H_2O$ gas. As an example of a nitrogen-based gas including N having a lone pair of electrons, it is possible to cite, e.g., an amine-based gas including an amine in which at least one of the hydrogen atoms of ammonia ($NH_3$) is substituted by a hydrocarbon group such as an alkyl group or the like. As the catalytic gas supplied from the gas supply pipe 232c, it is possible to use, e.g., a pyridine ($C_5H_5N$) gas which is an amine-based gas.

As shown in FIG. 10E, a variety of amines used as the catalytic gas include not only pyridine ($C_5H_5N$, pKa=5.67) but also aminopyridine ($C_5H_6N_2$, pKa=6.89), picoline ($C_6H_7N$, pKa=6.07), lutidine ($C_7H_9N$, pKa=6.96), piperazine ($C_4H_{10}N_2$, pKa=9.80), piperidine ($C_5H_{11}N$, pKa=11.12), and so forth. A variety of amines shown in FIG. 10E are cyclic amines whose hydrocarbon has a cyclic form. It can be said that the cyclic amines are heterocyclic compounds whose cyclic structure is configured by different types of elements such as C and N, namely nitrogen-containing heterocyclic compounds. It can be said that the amine-based gases as catalytic gases are amine-based catalytic gases.

In this regard, the amine-based gas refers to a gas phase amine, e.g., a gas obtained by vaporizing an amine kept in a liquid phase under a normal temperature and a normal pressure, or a gas including an amine or the like kept in a gas phase under a normal temperature and a normal pressure. It is sometimes the case that the term "amine" used herein means an "amine kept in a liquid phase", an "amine-based gas kept in a gas phase", or both. In the case of using an amine kept in a liquid phase under a normal temperature and a normal pressure, such as pyridine, aminopyridine, picoline, lutidine, piperazine and piperidine, the liquid phase amine is vaporized by a vaporizing system such as a vaporizer or a bubbler and is supplied as an amine-based gas (a pyridine gas, an aminopyridine gas, a picoline gas, a lutidine gas, a piperazine gas and a piperidine gas).

A modifying gas containing the specified Group III (such as a boron (B), indium (In) and the like) or Group V element (such as phosphorus (P), arsenic (As) and the like), e.g., a boron-containing gas (B-containing gas) containing B as a Group III element, is supplied from the gas supply pipe 232d into the process chamber 201 through the MFC 241d, the valve 243d, the nozzle 249d and the buffer chamber 237. The B-containing gas includes a gas including a borane-based compound. The gas including a borane-based compound includes borane-based gases, such as a monoborane ($BH_3$) gas and a diborane ($B_2H_6$) gas, and gases including a borane derivative in which at least one of hydrogen atoms (H) of the borane-based gases is substituted by other elements. The gases including a borane derivative include, e.g., haloborane-based gases in which H is substituted by a halogen element. As the B-containing gas supplied from the gas supply pipe 232d, it is possible to use, e.g., a trichloroborane ($BCl_3$) gas in which three H atoms of a monoborane are substituted by Cl atoms.

A modifying gas containing the specified Group III or Group V element, e.g., a phosphorus-containing gas (P-containing gas) including phosphorus (P) as a Group V element, is supplied from the gas supply pipe 232e into the process chamber 201 through the MFC 241e, the valve 243e, the gas supply pipe 232d, the nozzle 249d and the buffer chamber 237. The P-containing gas includes a gas including a phosphine-based compound. The gas including a phosphine-based compound includes phosphine-based gases, such as a phosphine ($PH_3$) gas and a diphosphine ($P_2H_4$) gas, and gases including a phosphine derivative in which at least one of hydrogen atoms of the phosphine-based gases is substituted by other elements. As the P-containing gas supplied from the gas supply pipe 232e, it is possible to use, e.g., a phosphine ($PH_3$) gas which is a phosphine-based gas.

In this regard, the borane-based gas and the gas including a borane derivative (hereinafter referred to as borane-based gases) refer to a gas phase borane-based compound, e.g., a gas obtained by vaporizing a borane-based compound kept in a liquid phase under a normal temperature and a normal pressure, or a gas including a borane-based compound or the like kept in a gas phase under a normal temperature and a normal pressure. Furthermore, the phosphine-based gas and the gas including a phosphine derivative (hereinafter referred to as phosphine-based gases) refer to a gas phase phosphine-based compound, e.g., a gas obtained by vaporizing a phosphine-based compound kept in a liquid phase under a normal temperature and a normal pressure, or a gas including a phosphine-based compound or the like kept in a gas phase under a normal temperature and a normal pressure. It is sometimes the case that the term "borane-based compound" used herein means a "borane-based compound kept in a liquid phase", a "borane-based compound kept in a gas phase", or both. Moreover, it is sometimes the case that the term "phosphine-based compound" used herein means a "phosphine-based compound kept in a liquid phase", a "phosphine-based compound kept in a gas phase", or both. In the case of using a borane-based compound or a phosphine-based compound kept in a liquid phase under a normal temperature and a normal pressure, the liquid phase borane-based compound or phosphine-based compound is vaporized by a vaporizing system such as a vaporizer or a bubbler and is supplied as a gas including a borane-based compound or a gas including a phosphine-based compound.

An assist gas (igniting gas) that assists in igniting plasma, e.g., an argon (Ar) gas, is supplied from the gas supply pipe 232f into the process chamber 201 through the MFC 241f, the valve 243f, the gas supply pipe 232d, the nozzle 249d and the buffer chamber 237.

An inert gas, e.g., a nitrogen ($N_2$) gas, is supplied from the gas supply pipes 232g to 232j into the process chamber 201 through the MFCs 241g to 242j, the valves 243g to 243j, the gas supply pipes 232a to 232d, the nozzles 249a to 249d and the buffer chamber 237. The $N_2$ gas as an inert gas also acts as a purge gas. The $N_2$ gas as an inert gas supplied from the gas supply pipe 232j sometimes acts as an assist gas that assists in igniting plasma.

In the case where the aforementioned gases are supplied from the respective gas supply pipes, a precursor gas supply system for supplying the precursor gas containing Si, C and a halogen element and having an Si—C bonding mainly includes the gas supply pipe 232a, the MFC 241a and the valve 243a. It may be considered that the nozzle 249a and the BTCSM gas supply source 242a are included in the precursor gas supply system. The precursor gas supply system may be referred to as a precursor supply system.

An oxidizing gas supply system mainly includes the gas supply pipe 232b, the MFC 241b and the valve 243b. It may be considered that the nozzle 249b and the $H_2O$ gas supply source 242b are included in the oxidizing gas supply system.

A catalytic gas supply system mainly includes the gas supply pipe 232c, the MFC 241c and the valve 243c. It may be considered that the nozzle 249c and the pyridine gas supply source 242c are included in the catalytic gas supply system. The catalytic gas supply system may be referred to as an amine-based catalytic gas supply system.

A modifying gas supply system for supplying the modifying gas containing the specified Group III or Group V element mainly includes the gas supply pipes 232d and 232e, the MFCs 241d and 241e and the valves 243d and 243e. It may be considered that the nozzle 249d, the buffer chamber 237, the BCl$_3$ gas supply source 242d and the PH$_3$ gas supply source 242e are included in the modifying gas supply system. The modifying gas supply system may be regarded as an aggregate of supply lines (supply systems) that supply different types of modifying gases containing different specified elements or different types of modifying gases differing in molecular structure from one another. That is to say, the modifying gas supply system may be regarded as an aggregate of a BCl$_3$ gas supply line mainly includes the gas supply pipe 232d, the MFC 241d and the valve 243d and a PH$_3$ gas supply line mainly includes the gas supply pipe 232e, the MFC 241e and the valve 243e. In this case, it may be considered that the nozzle 249d, the buffer chamber 237 and the corresponding individual modifying gas supply sources 242d and 242e are included in the respective supply lines.

An assist gas supply system for supplying the assist gas that assists in igniting plasma mainly includes the gas supply pipe 232f, the MFC 241f and the valve 243f. It may be considered that the nozzle 249d, the buffer chamber 237 and the Ar gas supply source 242f are included in the assist gas supply system. It may also be considered that the gas supply pipe 232j for supplying an N$_2$ gas as an assist gas, the MFC 241j, the valve 243j or the N$_2$ gas supply source 242j is included in the assist gas supply system. In this case, the assist gas supply system may be regarded as an aggregate of supply lines (supply systems) that supply different types of assist gases differing in molecular structure from one another. That is to say, the assist gas supply system may be regarded as an aggregate of an Ar gas supply line mainly includes the gas supply pipe 232f, the MFC 241f and the valve 243f and a N$_2$ gas supply line mainly includes the gas supply pipe 232j, the MFC 241j and the valve 243j. In this case, it may be considered that the nozzle 249d, the buffer chamber 237 and the corresponding individual gas supply sources 242f and 242j are included in the respective supply lines.

An inert gas supply system mainly includes the gas supply pipes 232g to 232j, the MFCs 241g to 241j and the valves 243g to 243j. It may be considered that the portions of the gas supply pipes 232a to 232d existing at the downstream side of the connection portions of the gas supply pipes 232a to 232d and the gas supply pipes 232g to 232j, the nozzles 249a to 249d, the buffer chamber 237 and the N$_2$ gas supply sources 242g to 242j are included in the inert gas supply system. The inert gas supply system also serves as a purge gas supply system.

A plurality of supply lines (supply systems) for supplying different types of gases differing in molecular structure from one another may be installed in the supply systems, such as the precursor gas supply system and the oxidizing gas supply system, other than the modifying gas supply system and the assist gas supply system.

Within the buffer chamber 237, as shown in FIG. 2, two rod-shaped electrodes 269 and 270 made of a conductive material and having an elongated structure are disposed to extend in the stacking direction of the wafers 200 from the lower portion of the reaction tube 203 to the upper portion thereof. Each of the rod-shaped electrodes 269 and 270 is installed parallel to the nozzle 249d. Each of the rod-shaped electrodes 269 and 270 is covered with, and protected by, an electrode protection pipe 275 from the upper portion to the lower portion thereof. One of the rod-shaped electrodes 269 and 270 is connected to a high-frequency power supply 273 through a matching unit 272 and the other is connected to the ground as a reference electric potential. If an RF (radio-frequency) power is applied from the high-frequency power supply 273 to between the rod-shaped electrodes 269 and 270 through the matching unit 272, plasma is generated in a plasma generation region 224 existing between the rod-shaped electrodes 269 and 270. A plasma source as a plasma generator (plasma generating part) mainly includes the rod-shaped electrodes 269 and 270 and the electrode protection pipes 275. It may be considered that the matching unit 272 and the high-frequency power supply 273 are included in the plasma source. As described below, the plasma source serves as an activating mechanism (exciting part) that activates (excites) a gas into plasma.

The electrode protection pipes 275 are formed into such a structure that the rod-shaped electrodes 269 and 270 can be inserted into the buffer chamber 237 in a state where the rod-shaped electrodes 269 and 270 are isolated from the internal atmosphere of the buffer chamber 237. In this regard, if the oxygen concentration within the electrode protection pipes 275 is substantially equal to the oxygen concentration of the ambient air (atmospheric air), the rod-shaped electrodes 269 and 270 inserted into the electrode protection pipes 275 are oxidized by the heat of the heater 207. For that reason, the oxygen concentration within the electrode protection pipes 275 is reduced by filling an inert gas such as an N$_2$ gas or the like into the electrode protection pipes 275 or by purging the interior of the electrode protection pipes 275 using an inert gas such as an N$_2$ gas or the like through the use of an inert gas purge mechanism. This makes it possible to suppress oxidation of the rod-shaped electrodes 269 and 270.

An exhaust pipe 231 for exhausting the internal atmosphere of the process chamber 201 is installed in the reaction tube 203. A vacuum pump 246 as a vacuum exhaust device is connected to the exhaust pipe 231 through a pressure sensor 245 as a pressure detector (pressure detecting part) for detecting the internal pressure of the process chamber 201 and an APC (Auto Pressure Controller) valve 244 as a pressure regulator (pressure regulating part). The APC valve 244 is a valve configured so that the vacuum exhaust of the interior of the process chamber 201 can be started and stopped by opening and closing the APC valve 244 while keeping the vacuum pump 246 in an operating state and so that the internal pressure of the process chamber 201 can be regulated by adjusting the valve opening degree based on the pressure information detected by the pressure sensor 245 while keeping the vacuum pump 246 in an operating state. An exhaust system mainly includes the exhaust pipe 231, the APC valve 244 and the pressure sensor 245. It may be considered that the vacuum pump 246 is included in the exhaust system. The exhaust pipe 231 is not limited to being installed in the reaction tube 203 but may be installed in the manifold 209 just like the nozzles 249a to 249d.

A seal cap 219 as a furnace port cover capable of air-tightly closing the lower end opening of the manifold 209 is installed below the manifold 209. The seal cap 219 is configured so as to make contact with the lower end portion of the manifold 209 from below in the vertical direction. The seal cap 219 is made of, e.g., a metal such as stainless steel or the like, and is formed into a disc shape. An O-ring 220b as a seal member which makes contact with the lower end portion of the manifold 209 is installed on the upper surface of the seal cap 219. A rotary mechanism 267 for rotating a boat 217 to be described later is installed at the opposite side of the seal cap 219 from the process chamber 201. The rotary mechanism 267 includes a rotary shaft 255 which extends through the seal cap 219. The rotary shaft 255 is connected to the boat 217. The rotary mechanism 267 is configured to rotate the boat 217, thereby rotating the wafers 200. The seal cap 219 is configured so that the seal cap 219 can be vertically moved up and down by a boat elevator 115 as an elevating mechanism vertically installed outside the reaction tube 203. The boat elevator 115 is configured so that the boat elevator 115 can carry the boat 217 into and out of the process chamber 201 by moving the seal cap 219 up and down. That is to say, the boat elevator 115 is configured to serve as a transfer device (transfer mechanism) for transferring the boat 217 and the wafers 200 supported on the boat 217 into and out of the process chamber 201.

The boat 217 as a substrate support member is made of, e.g., a heat resistant material such as quartz or silicon carbide and is configured to support the wafers 200 horizontally stacked in multiple stages with the centers of the wafers 200 concentrically aligned with one another. A heat insulating member 218 made of, e.g., a heat resistant material such as quartz or silicon carbide is installed below the boat 217 and is configured such that the heat generated from the heater 207 is hardly transferred to the seal cap 219. Moreover, the heat insulating member 218 may be configured by a plurality of heat insulating plates made of a heat resistant material such as quartz or silicon carbide and a heat insulating plate holder configured to support the heat insulating plates in a horizontal posture in multiple stages.

A temperature sensor 263 as a temperature detector is installed within the reaction tube 203. Based on the temperature information detected by the temperature sensor 263, an electrical conduction state to the heater 207 is controlled such that the internal temperature of the process chamber 201 becomes a desired temperature distribution. As with the nozzles 249a to 249d, the temperature sensor 263 is formed into an L-like shape and is installed along the inner wall of the reaction tube 203.

Figure 3:
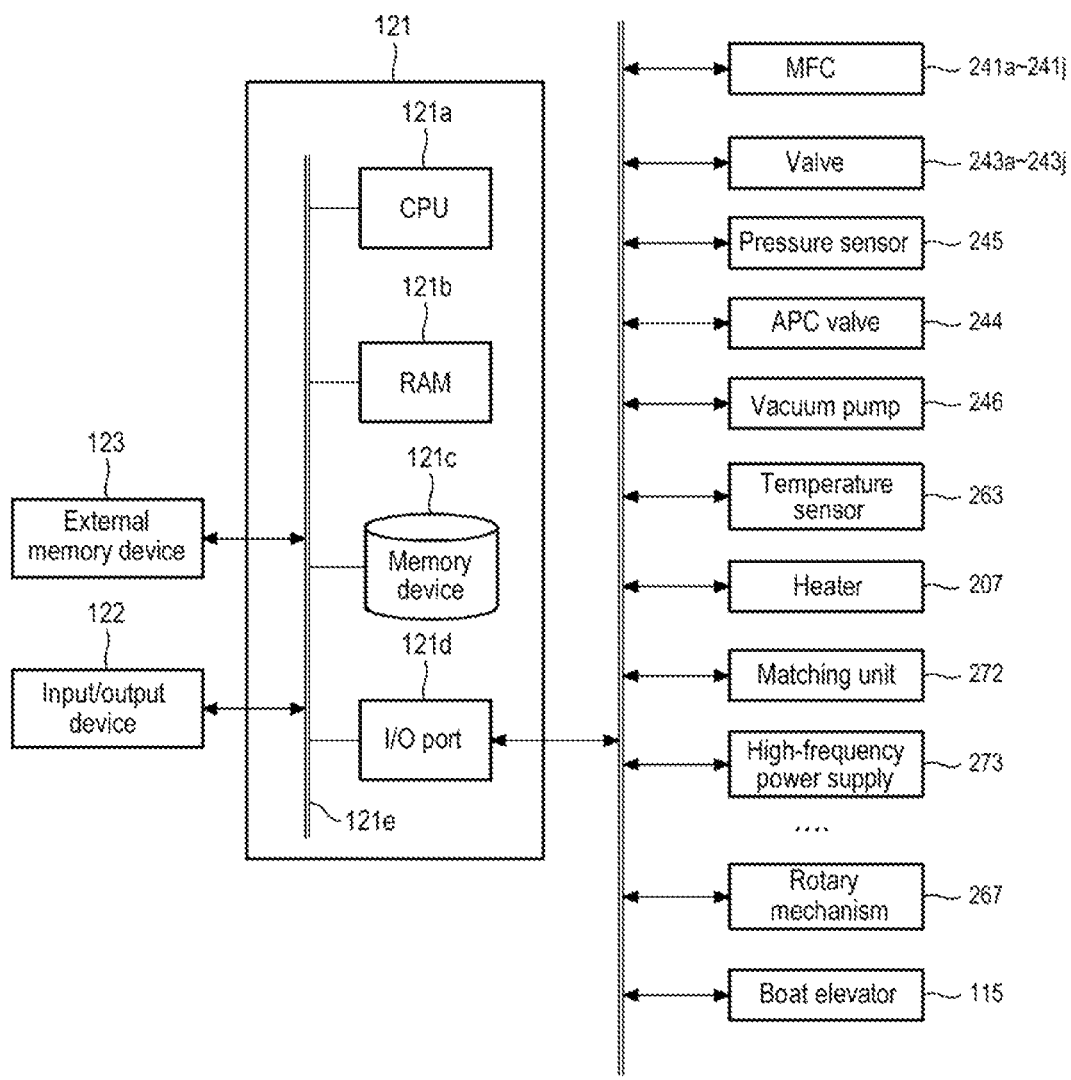
FIG. 3 is a schematic configuration view of a controller for a substrate processing apparatus appropriately used in the first embodiment of the present disclosure, showing a control system of the controller in a block diagram.

As illustrated in FIG. 3, a controller 121 as a control unit (control part) is configured by a computer which includes a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured by, e.g., a touch panel or the like, is connected to the controller 121.

The memory device 121c is configured by, e.g., a flash memory, an HDD (Hard Disc Drive), or the like. A control program for controlling the operation of the substrate processing apparatus or a process recipe defining sequences and conditions of substrate processing, such as film forming or the like, to be described later is readably stored in the memory device 121c. The process recipe, which serves as a program, is configured to have the controller 121 execute individual sequences in the substrate processing process, such as a film forming process or the like, to be described later, thereby obtaining a predetermined result. In the following description, the process recipe and the control program are sometimes generally referred to as a "program". The term "program" used herein is intended to include only the process recipe, only the control program, or both. In addition, the RAM 121b is configured as a memory area (work area) in which programs or data read by the CPU 121a is temporarily stored.

The I/O port 121d is connected to the MFCs 241a to 241j, the valves 243a to 243j, the pressure sensor 245, the APC valve 244, the vacuum pump 246, the temperature sensor 263, the heater 207, the matching unit 272, the high-frequency power supply 273, the rotary mechanism 267, the boat elevator 115, and so forth.

The CPU 121a is configured to read the control program from the memory device 121c and to execute the control program. Pursuant to the input of an operation command from the input/output device 122, the CPU 121a is configured to read the process recipe from the memory device 121c. In addition, the CPU 121a is configured to, pursuant to the content of the read process recipe, control the flow rate controlling operation for various types of gases performed by the MFCs 241a to 241j, the opening/closing operation of the valves 243a to 243j, the opening/closing operation of the APC valve 244, the pressure regulating operation performed by the APC valve 244 based on the pressure sensor 245, the start and stop operation of the vacuum pump 246, the temperature regulating operation of the heater 207 based on the temperature sensor 263, the operation of rotating the boat 217 and adjusting the rotation speed of the boat 217 rotated by the rotary mechanism 267, the elevating/lowering operation of the boat 217 performed by the boat elevator 115, the impedance adjusting operation performed by the matching unit 272, the power supply operation of the high-frequency power supply 273, and so forth.

Moreover, the controller 121 is not limited to being configured as a dedicated computer but may be configured as a general-purpose computer. For example, the controller 121 according to the present embodiment may be configured by preparing an external memory device 123 in which the aforementioned program is stored (e.g., a magnetic tape, a magnetic disc such as a flexible disc or a hard disc, an optical disc such as a CD or a DVD, a magneto-optical disc such as an MO or the like, and a semiconductor memory such as a USB memory or a memory card), and installing the program on the general-purpose computer using the external memory device 123. Furthermore, the means for supplying a program to a computer is not limited to a case in which the program is supplied through the external memory device 123. For example, the program may be supplied using a communication means such as the Internet or a dedicated line without going through the external memory device 123. Moreover, the memory device 121c or the external memory device 123 is configured by a non-transitory computer-readable recording medium. In the following description, these means for supplying the program will be simply referred to as "a recording medium." In addition, the term "recording medium" used herein is intended to include only the memory device 121c, only the external memory device 123, or both.

(2) THIN FILM FORMING PROCESS

Next, one example of a sequence for forming a thin film on a substrate will be described as one example of a process of manufacturing a semiconductor device through the use of the processing furnace 202 of the substrate processing apparatus described above. In the following description, the operations of the respective parts constituting the substrate processing apparatus are controlled by the controller 121.

In the present embodiment, a thin film containing silicon (Si), oxygen (O), carbon (C) and a specified Group III or Group V element is formed on a wafer 200 as a substrate by performing a cycle a predetermined number of times. The cycle includes: a step of supplying a precursor gas containing silicon (Si), carbon (C) and a halogen element and having an Si—C bonding, and a first catalytic gas to the wafer 200; a step of supplying an oxidizing gas and a second catalytic gas to the wafer 200; and a step of supplying a modifying gas containing the specified Group III or Group V element to the wafer 200.

In this regard, the cycle including "the step of supplying a precursor gas and a first catalytic gas", "the step of supplying an oxidizing gas and a second catalytic gas" and "the step of supplying a modifying gas" means that one cycle includes performing the respective steps one or more times. Accordingly, in one cycle, the respective steps may be performed once, or at least one step may be performed a plurality of times. In one cycle, the respective steps may be performed either the same number of times or a different number of times. The order of execution of the respective steps within a cycle can be arbitrarily decided. By appropriately changing the number of execution times of the respective steps, the order of execution of the respective steps and the combination thereof in the aforementioned manner, it is possible to form thin films differing in film quality, film composition and component ratio. "The cycle being performed a predetermined number of times" means the cycle being performed one or more times, namely the cycle being performed once or a plurality of times.

For instance, one cycle of the present embodiment includes: a step of forming a first thin film containing Si, O and C on the wafer 200 by performing a set a predetermined number of times; and a step of modifying the first thin film into a second thin film further containing the specified Group III or Group V element in addition to silicon, oxygen and carbon by performing a step of supplying the modifying gas to the wafer 200. The set includes: a step of supplying the precursor gas and the first catalytic gas to the wafer 200; and a step of supplying the oxidizing gas and the second catalytic gas to the wafer 200.

In the present embodiment, the respective steps are performed under a non-plasma atmosphere.

In the present embodiment, the supply conditions of different types of gases that include a plurality of elements constituting a thin film is controlled in such a way that the composition ratio of the formed thin film becomes a stoichiometric composition or a predetermined composition ratio differing from the stoichiometric composition. For example, the supply conditions are controlled in such a way that at least one element of the plurality of elements constituting the formed thin film becomes more excessive than the remaining elements in terms of the stoichiometric composition. Description will now be made of one example of a sequence for performing film formation while controlling the ratio of a plurality of elements constituting the formed thin film, namely the composition ratio of the thin film.

Figure 4:
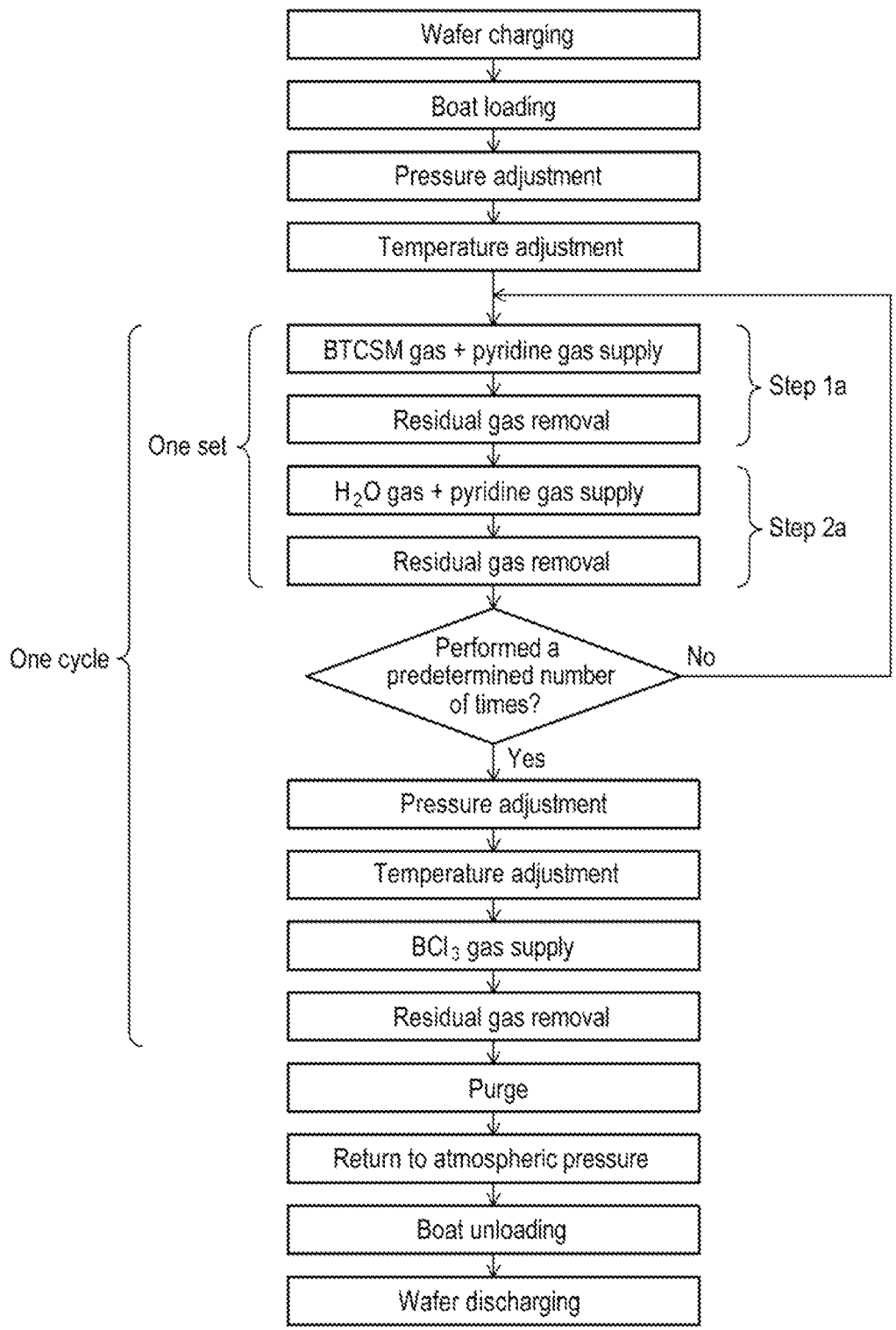
FIG. 4 is a view showing a film-forming flow in a film-forming sequence of the first embodiment of the present disclosure.

A film-forming sequence of the present embodiment will now be described with reference to FIGS. 4 and 5A.

Description will be made herein of an example where a cycle which includes: a step of forming a silicon oxycarbide film (SiOC film) as a first thin film containing Si, O and C on a wafer 200 by performing a set a predetermined number of times (n times). The set includes: a step of supplying a BTCSM gas as the precursor gas and a pyridine gas as the first catalytic gas to the wafer 200 (Step 1a); a step of supplying an H$_2$O gas as the oxidizing gas and a pyridine gas as the second catalytic gas to the wafer 200 (Step 2a); and a step of modifying the SiOC film to an SiOC film including B as a second thin film further containing B in addition to Si, 0, and C by performing a step of supplying a BCl$_3$ gas as the modifying gas to the wafer 200, is performed a predetermined number of times, e.g., once.

By the present film-forming sequence, an SiOC film doped (added) with B as a thin film containing Si, O, C and B is formed on the wafer 200. The SiOC film doped with B may be changed to a silicon oxycarbon boride film (SiOCB film), a silicon oxyboron carbide film (SiOBC film), or the like.

It is sometimes the case that the term "wafer" used herein means a "wafer per se" or a "laminate (aggregate) of a wafer and a specified layer or film formed on the wafer" (namely, a wafer including a specified layer or film formed on the wafer). Furthermore, it is sometimes the case that the term "surface of a wafer" used herein means a "surface (exposed surface) of a wafer per se" or a "surface of a specified layer or film formed on a wafer, namely an uppermost surface of a wafer as a laminate".

Accordingly, it is sometimes the case that the expression "a specified gas being supplied to a wafer" used herein means "a specified gas being directly supplied to the surface (exposed surface) of a wafer per se" or "a specified gas being supplied to a layer or a film formed on a wafer, namely on the uppermost surface of a wafer as a laminate". Furthermore, it is sometimes the case that the expression "a specified layer (or film) being formed on a wafer" used herein means "a specified layer (or film) being directly formed on the surface (exposed surface) of a wafer per se" or "a specified layer (or film) being formed on a layer or a film formed on a wafer, namely on the uppermost surface of a wafer as a laminate".

The term "substrate" used herein is synonymous with the term "wafer". In that case, the "wafer" appearing in the above description may be replaced by a "substrate".

(Wafer Charging and Boat Loading)

If a plurality of wafers 200 is charged on the boat 217 (wafer charging), as illustrated in FIG. 1, the boat 217 charged with the wafers 200 is lifted up by the boat elevator 115 and is loaded into the process chamber 201 (boat loading). In this state, the seal cap 219 seals the lower end portion of the manifold 209 through the O-ring 220b.

(Pressure Adjustment and Temperature Adjustment)

The interior of the process chamber 201 is vacuum-exhausted by the vacuum pump 246 to a desired pressure (a desired vacuum level). At this time, the internal pressure of the process chamber 201 is measured by the pressure sensor 245. The APC valve 244 is feedback-controlled based on the measured pressure information (pressure adjustment). The vacuum pump 246 continues to operate at least until the processing of the wafers 200 is finished. The wafers 200 existing within the process chamber 201 are heated by the heater 207 to a desired temperature. At this time, the electrical conduction state to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 is continuously performed at least until the processing of the wafers 200 is finished. However, as described later, the heating of the interior of the process chamber 201 by the heater 207 may not be performed if the wafers 200 are processed at a room temperature. Subsequently, the boat 217 and the wafers 200 begin to be rotated by the rotary mechanism 267. The rotation of the boat 217 and the wafers 200 by the rotary mechanism 267 is continuously performed at least until the processing of the wafers 200 is finished.

(SiOC Film Forming Process)

Thereafter, the following two steps, namely steps 1a and 2a, are performed one after another.

[Step 1a]
(BTCSM Gas+Pyridine Gas Supply)

The valve 243a is opened and a BTCSM gas is allowed to flow through the gas supply pipe 232a. The flow rate of the BTCSM gas is regulated by the MFC 241a. The BTCSM gas is supplied from the gas supply holes 250a into the process chamber 201 and is exhausted from the exhaust pipe 231. In this way, the BTCSM gas is supplied to the wafers 200 (BTCSM gas supply). At the same time, the valve 243g is opened and an inert gas such as an $N_2$ gas or the like is allowed to flow through the gas supply pipe 232g. The flow rate of the $N_2$ gas is regulated by the MFC 241g. The $N_2$ gas is supplied into the process chamber 201 together with the BTCSM gas and is exhausted from the exhaust pipe 231.

The valve 243c is opened and a pyridine gas is allowed to flow through the gas supply pipe 232c. The flow rate of the pyridine gas is regulated by the MFC 241c. The pyridine gas is supplied from the gas supply holes 250c into the process chamber 201 and is exhausted from the exhaust pipe 231. In this way, the pyridine gas is supplied to the wafers 200 (pyridine gas supply). At the same time, the valve 243i is opened and an inert gas such as an $N_2$ gas or the like is allowed to flow through the gas supply pipe 232i. The flow rate of the $N_2$ gas is regulated by the MFC 241i. The $N_2$ gas is supplied into the process chamber 201 together with the pyridine gas and is exhausted from the exhaust pipe 231.

In order to prevent the BTCSM gas and the pyridine gas from entering the nozzles 249b and 249d or the buffer chamber 237, the valves 243h and 243j are opened and an $N_2$ gas is allowed to flow through the gas supply pipes 232h and 232j. The $N_2$ gas is supplied into the process chamber 201 through the gas supply pipes 232b and 232d, the nozzles 249b and 249d and the buffer chamber 237 and is exhausted from the exhaust pipe 231.

At this time, the APC valve 244 is appropriately adjusted such that the internal pressure of the process chamber 201 is kept, e.g., in a range of 1 to 13330 Pa, specifically 133 to 2666 Pa, e.g., at 1333 Pa. The supply flow rate of the BTCSM gas controlled by the MFC 241a is kept, e.g., in a range of 1 to 2000 sccm, specifically 10 to 1000 sccm. The supply flow rate of the pyridine gas controlled by the MFC 241c is kept, e.g., in a range of 1 to 2000 sccm, specifically 10 to 1000 sccm. The supply flow rates of the $N_2$ gas controlled by the MFCs 241g to 241j are respectively kept, e.g., in a range of 100 to 10000 sccm. The time duration for supplying the BTCSM gas and the pyridine gas to the wafers 200, namely the gas supply time (irradiation time), is set, e.g., in a range of 1 to 100 seconds, specifically 5 to 60 seconds.

At this time, the temperature of the heater 207 is set such that the temperature of the wafers 200 is kept, e.g., in a range of from a room temperature to 150 degrees C., specifically from a room temperature to 100 degrees C., more specifically from 50 degrees C. to 100 degrees C. In the case where no catalytic gas is supplied during the supply of the BTCSM gas, if the temperature of the wafers 200 is less than 250 degrees C., it is hard for wafers 200 to absorb BTCSM. Thus, it is sometimes impossible to obtain a practical film forming rate. If the pyridine gas as the catalytic gas is supplied as in the present embodiment, the aforementioned problem can be eliminated even though the temperature of the wafers 200 is less than 250 degrees C. If the temperature of the wafers 200 is kept not more than 150 degrees C. or not more than 100 degrees C. under the existence of the pyridine gas, it is possible to reduce the heat amount applied to the wafers 200 and to satisfactorily control the thermal budget of the wafers 200. If the temperature of the wafers 200 is kept equal to or higher than room temperature under the existence of the pyridine gas, it is possible to enable BTCSM to be sufficiently adsorbed to the wafers 200 and to obtain a sufficient film forming rate. Accordingly, the temperature of the wafers 200 may be kept in a range of from a room temperature to 150 degrees C., specifically from a room temperature to 100 degrees C., more specifically from 50 degrees C. to 100 degrees C.

By supplying the BTCSM gas to the wafers 200 under the aforementioned conditions, a first layer, e.g., a silicon-containing layer (Si-containing layer) having a thickness of from less than one atomic layer to several atomic layers and containing C and Cl, is formed on the wafers 200 (the base films on the surfaces of the wafers 200). The Si-containing layer containing C and Cl may be a silicon layer (Si layer) containing C and Cl, an adsorption layer of the BTCSM gas, or both.

In this regard, the Si layer containing C and Cl is a generic name which includes a discontinuous layer in addition to a continuous layer formed of Si and containing C and Cl, or a silicon thin film (Si thin film) containing C and Cl formed by laminating non-continuous layers. The continuous layer formed of Si and containing C and Cl is sometimes referred to as an Si thin film containing C and Cl. Si that constitutes the Si layer containing C and Cl includes not only Si whose bonding to C or Cl is not completely broken but also Si whose bonding to C or Cl is completely broken.

The adsorption layer of the BTCSM gas includes an adsorption layer in which the molecules of the BTCSM gas are continuous and an adsorption layer in which the molecules of the BTCSM gas are discontinuous. That is to say, the adsorption layer of the BTCSM gas includes an adsorption layer that contains BTCSM molecules having a thickness of one molecular layer or less than one molecular layer. The BTCSM $[(SiCl_3)_2CH_2]$ molecule constituting the adsorption layer of the BTCSM gas includes a molecule in which bonding of Si and C is partially broken, or a molecule in which bonding of Si and Cl is partially broken, in addition to a molecule represented by the chemical structural formula of FIG. 10A. That is to say, the adsorption layer of the BTCSM gas includes a chemisorption layer of BTCSM molecules and a physisorption layer of BTCSM molecules.

The layer having a thickness of less than one atomic layer means a discontinuously formed atomic layer. The layer having a thickness of one atomic layer means a continuously formed atomic layer. Furthermore, the layer having a thickness of less than one molecular layer means a discontinuously formed molecular layer. The layer having a thickness of one molecular layer means a continuously formed molecular layer. Moreover, the Si-containing layer containing C and Cl may include both the Si layer containing C and Cl and the adsorption layer of the BTCSM gas. As mentioned above, the expressions "one atomic layer", "several atomic layers" and the like are used with respect to the Si-containing layer containing C and Cl.

If the thickness of the Si-containing layer containing C and Cl formed on the wafer 200 as a first layer exceeds several atomic layers, the oxidizing action in Step 2a to be described later does not affect the entire first layer. The minimum value of the thickness of the first layer that can be formed on the wafer 200 is less than one atomic layer. Accordingly, the thickness of the first layer may be approximately from less than one atomic layer to several atomic layers. By setting the thickness of the first layer to become not more than one atomic layer, namely one atomic layer or less than one atomic layer, it is possible to relatively increase the action of an oxidizing reaction in Step 2a to be described later and to shorten the time required in the oxidizing reaction in Step 2a. It is also possible to shorten the time required in the formation of the first layer in Step 1a. Consequently, it is possible to shorten the processing time per one set and to shorten the overall processing time. That is to say, it becomes possible to increase the film forming rate. By setting the thickness of the first layer to become not more than one atomic layer, it becomes possible to increase the controllability of the film thickness uniformity.

Under the condition in which the BTCSM gas is self-decomposed (pyrolyzed), namely the condition in which the pyrolysis reaction of BTCSM occurs, Si is deposited on the wafer 200 to thereby form an Si layer containing C and Cl. Under the condition in which the BTCSM gas is not self-decomposed (pyrolyzed), namely the condition in which the pyrolysis reaction of BTCSM does not occur, the BTCSM gas is adsorbed to the wafer 200 to thereby form an adsorption layer of the BTCSM gas. The film forming rate can be made higher when forming the Si layer containing C and Cl on the wafer 200 than when forming the adsorption layer of the BTCSM gas on the wafer 200. Thus, it is desirable to form the Si layer containing C and Cl on the wafer 200. In the present embodiment, the temperature of the wafer 200 is kept at a low temperature of, e.g., 150 degrees C. or less. Therefore, there is a possibility that the formation of the adsorption layer of the BTCSM gas on the wafer 200 is superior to the formation of the Si layer containing C and Cl on the wafer 200. If no catalytic gas is supplied, there is a possibility that the physisorption becomes dominant than the chemisorprion in the adsorption layer of the BTCSM gas. The bonding of the BTCSM molecules to the base layer such as the surface of the wafer 200 or the like and the bonding between the BTCSM molecules in the physisorption are weaker than in the chemisorption. That is to say, if no catalytic gas is supplied, there is a possibility that the adsorption layer of the BTCSM gas is predominantly composed of a physisorption layer of the BTCSM gas.

Figure 6A:
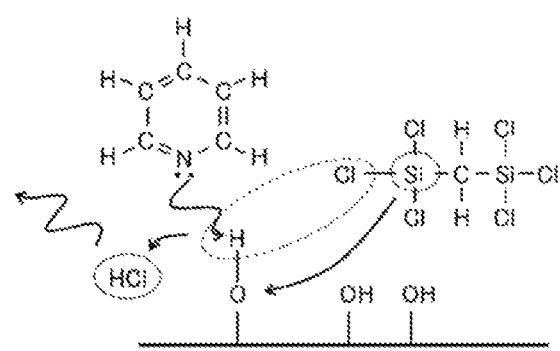

The pyridine gas as the catalytic gas weakens the bonding force of an O—H bond existing on the surface of the wafer 200, thereby promoting the decomposition of the BTCSM gas and accelerating the formation of the first layer by the chemisorption of the BTCSM molecule. That is to say, as shown in FIG. 6A, the pyridine gas as the catalytic gas acts on, e.g., the O—H bond existing on the surface of the wafer 200, thereby weakening the bonding force between O and H. The H having a weakened bonding force and the Cl of the BTCSM gas react with each other, whereby a hydrogen chloride (HCl) gas is generated and desorbed. The BTCSM molecule (halide) which has lost Cl is chemically adsorbed to the surface of the wafer 200. That is to say, a chemisorption layer of the BTCSM gas is formed on the surface of the wafer 200. The reason for the pyridine gas weakening the bonding force between O and H is that an N atom of a pyridine molecule, which has a lone pair of electrons, acts to attract H. For example, the aforementioned acid dissociation constant (pKa) can be used as one of the indices indicating the magnitude of the action by which a specified compound containing an N atom and the like attracts H.

As mentioned earlier, the pKa is a constant that indicates the equilibrium constant Ka in a dissociation reaction in which hydrogen ions are emitted from an acid, in terms of a negative common logarithm. A compound showing a large pKa has a strong H-attraction force. For instance, if a compound showing a pKa of 5 or more is used as the catalytic gas, it is possible to promote the decomposition of the BTCSM gas and to accelerate the formation of the first layer. On the other hand, if the pKa of the catalytic gas is unduly large, Cl removed from a BTCSM molecule is coupled to the catalytic gas. A component generated by the coupling, namely a salt (ion compound) such as ammonium chloride ($NH_4Cl$) or the like, becomes particles in some cases. In order to suppress the generation of particles, the pKa of the catalytic gas may be set to not more than 11, specifically not more than 7. The pyridine gas shows a relatively large pKa of about 5.67 and has a strong H-attraction force. Since the pKa is not more than 7, particles are hard to generate.

By supplying the pyridine gas as the catalytic gas together with the BTCSM gas in the aforementioned manner, even under a low temperature condition of, e.g., 150 degrees C. or less, it is possible to accelerate the decomposition of the BTCSM gas and to form the first layer such that the formation of a chemisorption layer of the BTCSM gas rather than the formation of a physisorption layer of the BTCSM gas becomes dominant.

By using the BTCSM gas as the precursor gas containing Si, C and a halogen element and having an Si—C bonding as described above, even under a low temperature condition of, e.g., 150 degrees C. or less, it is possible to introduce C into the first layer. The first layer containing C is oxidized in Step 2a performed later. Thus, it is possible to form, e.g., a silicon oxycarbide layer (SiOC layer) containing C at a high concentration, or a SiOC film composed of laminated SiOC layers and containing C at a high concentration. It is also possible to accurately control the C concentration in the SiOC layer or the SiOC film.

(Residual Gas Removal)

After the Si-containing layer containing C and Cl as the first layer is formed on the wafer 200, the valve 243a is closed to stop the supply of the BTCSM gas. Furthermore, the valve 243c is closed to stop the supply of the pyridine gas. At this time, the APC valve 244 of the exhaust pipe 231 is opened and the interior of the process chamber 201 is vacuum-exhausted by the vacuum pump 246, whereby the unreacted gas remaining within the process chamber 201 or the BTCSM gas and the pyridine gas contributed to the formation of the first layer is removed from the interior of the process chamber 201 (residual gas removal). Moreover, the valves 243g to 243j are opened and the supply of the $N_2$ gas as the inert gas into the process chamber 201 is maintained. The $N_2$ gas acts as a purge gas. This makes it possible to increase the effect of removing the unreacted gas remaining within the process chamber 201 or the BTCSM gas and the pyridine gas contributed to the formation of the first layer from the interior of the process chamber 201.

At this time, the gas remaining within the process chamber 201 may not be completely removed and the interior of the process chamber 201 may not be completely purged. If the amount of the gas remaining within the process chamber 201 is small, the gas does not adversely affect Step 2a to be performed later. The flow rate of the $N_2$ gas supplied into the process chamber 201 need not be made large. For example, by supplying the $N_2$ gas in an amount substantially equal to the volume of the reaction tube 203 (the process chamber 201), it is possible to perform purging such that the $N_2$ gas does not adversely affect Step 2a. By not completely purging the interior of the process chamber 201 in this manner, it is possible to shorten the purge time and to enhance the throughput. It is also possible to reduce the consumption of the $N_2$ gas to a necessary minimum amount.

As the precursor gas containing Si, C and a halogen element and having an Si—C bonding, it may be possible to use not only the BTCSM gas but also a BTCSE gas, a TCDMDS gas, a DCTMDS gas, an MCPMDS gas or the like. As the catalytic gas, it may be possible to use not only the pyridine gas but also a cyclic amine-based gas such as an aminopyridine gas, a picoline gas, a lutidine gas, a piperazine gas, a piperidine gas or the like and a non-amine-based gas such as an ammonia ($NH_3$, pKa=9.2) gas or the like. As the inert gas, it may be possible to use not only the $N_2$ gas but also a rare gas such as an Ar gas, a He gas, a Ne gas, a Xe gas or the like.

[Step 2a]
($H_2O$ Gas+Pyridine Gas Supply)

After finishing Step 1a and removing the gas remaining within the process chamber 201, the valve 243b is opened and an $H_2O$ gas is allowed to flow through the gas supply pipe 232b. The flow rate of the $H_2O$ gas is regulated by the MFC 241b. The $H_2O$ gas is supplied from the gas supply holes 250b into the process chamber 201 and is exhausted from the exhaust pipe 231. In this way, the $H_2O$ gas is supplied to the wafer 200 under a non-plasma atmosphere ($H_2O$ gas supply). At the same time, the valve 243h is opened and an $N_2$ gas as an inert gas is allowed to flow into the gas supply pipe 232h. The flow rate of the N2 gas is regulated by the MFC 241h. The $N_2$ gas is supplied into the process chamber 201 together with the $H_2O$ gas and is exhausted from the exhaust pipe 231.

As with the supply of the pyridine gas performed in Step 1a, a pyridine gas is supplied to the wafer 200.

In order to prevent the $H_2O$ gas and the pyridine gas from entering the nozzles 249a and 249d or the buffer chamber 237, the valves 243g and 243j are opened and an $N_2$ gas is allowed to flow through the gas supply pipes 232g and 232j. The $N_2$ gas is supplied into the process chamber 201 through the gas supply pipes 232a and 232d, the nozzles 249a and 249d and the buffer chamber 237 and is exhausted from the exhaust pipe 231.

At this time, the APC valve 244 is appropriately adjusted such that the internal pressure of the process chamber 201 is kept, e.g., in a range of 1 to 13330 Pa, specifically 133 to 2666 Pa, e.g., at 1333 Pa. The supply flow rate of the $H_2O$ gas controlled by the MFC 241b is kept, e.g., in a range of 1000 to 10000 sccm, specifically 10 to 1000 sccm. The supply flow rate of the pyridine gas controlled by the MFC 241c is kept, e.g., in a range of 1 to 2000 sccm, specifically 10 to 1000 sccm. The supply flow rates of the $N_2$ gas controlled by the MFCs 241g to 241j are respectively kept, e.g., in a range of 100 to 10000 sccm. The time duration required in supplying the $H_2O$ gas and the pyridine gas to the wafer 200, namely the gas supply time (irradiation time), is set, e.g., in a range of 1 to 100 seconds, specifically 5 to 60 seconds. The temperature of the heater 207 is set such that the temperature of the wafer 200 is kept in the same temperature range as the temperature of the wafer 200 used in Step 1a, e.g., in a range of from a room temperature to 150 degrees C., specifically from a room temperature to 100 degrees C., more specifically from 50 degrees C. to 100 degrees C.

The $H_2O$ gas supplied into the process chamber 201 is thermally activated and is exhausted from the exhaust pipe 231. At this time, the thermally activated $H_2O$ gas is supplied to the wafer 200. That is to say, the gas flowing into the process chamber 201 is the thermally activated $H_2O$ gas. The BTCSM gas does not flow into the process chamber 201. Accordingly, the $H_2O$ gas does not make any gas phase reaction and is supplied to the wafer 200 in an activated state. The $H_2O$ gas reacts with at least a portion of the first layer (the Si-containing layer containing C and Cl) formed on the wafer 200 in Step 1a. Thus, the first layer is thermally oxidized under a non-plasma atmosphere and is converted to a second layer containing Si, O and C, namely an SiOC layer.

Figure 6B:
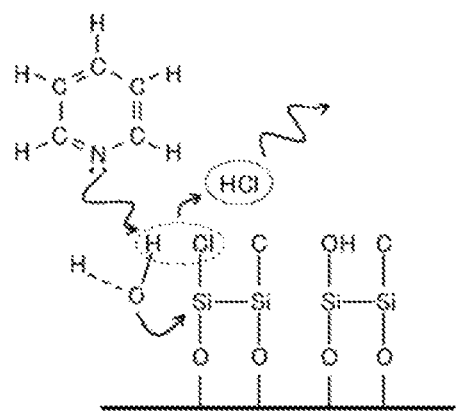

The pyridine gas as the catalytic gas weakens the bonding force of an O—H bonding of the $H_2O$ gas, thereby promoting the decomposition of the $H_2O$ gas and accelerating the reaction of the $H_2O$ gas and the first layer. That is to say, as shown in FIG. 6B, the pyridine gas as the catalytic gas acts on the O—H bonding of the $H_2O$ gas, thereby weakening the bonding force between O and H. The H having a weakened bonding force and the Cl of the first layer formed on the wafer 200 react with each other, whereby a hydrogen chloride (HCl) gas is generated and desorbed. The O of the $H_2O$ gas which has lost H is bonded to the Si of the first layer from which Cl is desorbed with at least a portion of C left therein.

In the step of supplying the $H_2O$ gas and the pyridine gas, the supply amount of the pyridine gas can be appropriately adjusted depending on the desired film composition. If the supply amount of the pyridine gas is increased, the action of the pyridine gas is made strong and the oxidizing power of the $H_2O$ gas is increased, whereby the Si—C bonding is easily broken and the C is easily desorbed. As a result, the C concentration in the SiOC layer is decreased. Therefore, by appropriately adjusting the supply amount of the pyridine gas, it is possible to relatively change the C concentration, the silicon concentration (Si concentration) and the oxygen concentration (O concentration) in the SiOC layer and in the SiOC film formed by laminating the SiOC layers.

The adjustment of the supply amount of the catalytic gas supplied in the step of supplying the oxidizing gas and the second catalytic gas can be performed independently of the aforementioned adjustment of the supply amount of the catalytic gas supplied in the step of supplying the precursor gas and the first catalytic gas. That is to say, the supply amount of the catalytic gas may be adjusted so that the supply amounts of the catalytic gas in the two steps become equal to each other or differ from each other.

At this time, if a plurality of process recipes in which the supply amount, the flow rate and the like of the catalytic gas are set in different values (a plurality of programs which defines processing procedures and processing conditions) is prepared in advance, it becomes easy to adjust the supply amount of the catalytic gas. In order to perform a film-forming process, it is only necessary for an operator to appropriately select a proper process recipe depending on the desired film composition. Accordingly, thin films of various composition ratios and various qualities can be formed by a single substrate processing apparatus with increased versatility and reproducibility. It is also possible to alleviate the operation burden (such as the input burden of processing procedures and processing conditions) borne by an operator. This makes it possible to rapidly start the substrate processing while avoiding an operational error.

Under a low temperature condition of, e.g., 150 degrees C. or less, an SiOC layer containing a relatively large amount of water ($H_2O$) is formed with ease. For that reason, it is sometimes the case that a large amount of water is contained in the SiOC film formed by laminating the SiOC layers. The water contained in the SiOC layer or the SiOC film originates from, e.g., the $H_2O$ gas used as the oxidizing gas.

(Residual Gas Removal)

Thereafter, the valve 243b is closed to stop the supply of the $H_2O$ gas. Furthermore, the valve 243c is closed to stop the supply of the pyridine gas. At this time, the APC valve 244 of the exhaust pipe 231 is opened and the interior of the process chamber 201 is vacuum-exhausted by the vacuum pump 246, whereby the unreacted or reaction-contributed $H_2O$ gas or pyridine gas and the reaction byproducts remaining within the process chamber 201 are removed from the interior of the process chamber 201 (residual gas removal). Moreover, the valves 243g to 243j are opened and the supply of the $N_2$ gas as the inert gas into the process chamber 201 is maintained. The $N_2$ gas acts as a purge gas. This makes it possible to increase the effect of removing the unreacted $H_2O$ gas or pyridine gas, the $H_2O$ gas or pyridine gas contributed to the formation of the second layer and the reaction byproducts remaining within the process chamber 201 from the interior of the process chamber 201.

At this time, the gas remaining within the process chamber 201 may not be completely removed and the interior of the process chamber 201 may not be completely purged. If the amount of the gas remaining within the process chamber 201 is small, the gas does not adversely affect Step 1a to be performed later. The flow rate of the $N_2$ gas supplied into the process chamber 201 need not be made large. For example, by supplying the $N_2$ gas in an amount substantially equal to the volume of the reaction tube 203 (the process chamber 201), it is possible to perform a purge such that the $N_2$ gas does not adversely affect Step 1a. By not completely purging the interior of the process chamber 201 in this manner, it is possible to shorten the purge time and to enhance the throughput. It is also possible to reduce the consumption of the $N_2$ gas to a necessary minimum amount.

As the oxidizing gas, it may be possible to use not only the $H_2O$ gas but also a hydrogen peroxide ($H_2O_2$) gas, a hydrogen ($H_2$) gas+an oxygen ($O_2$) gas, a $H_2$ gas+an ozone ($O_3$) gas, and so forth. As the catalytic gas, it may be possible to use not only the pyridine gas but also the various types of amine-based gases mentioned above or the non-amine-based gases. As the inert gas, it may be possible to use not only the $N_2$ gas but also the various types of rare gases mentioned above.

According to a study conducted by the present inventors, when comprehensively decided within the extent of the gas systems and the conditions of the present embodiment, it is considered that the pyridine gas is superior as the catalytic gas throughout the respective steps. The TEA gas is next, and subsequently, the piperidine gas is suitable.

(Performing a Predetermined Number of Times)

One set including Steps 1a and 2a described above is performed one or more times, namely a predetermined number of times (n times), whereby an SiOC film having a specified composition and a specified thickness can be formed on the wafer 200. The set may be repeated a plurality of times. That is to say, the thickness of an SiOC layer formed every set may be set smaller than a desired film thickness and the set may be repeated a plurality of times until the thickness of the SiOC film reaches the desired film thickness.

At this time, by controlling the processing conditions of the respective steps such as the internal pressure of the process chamber 201, the gas supply time and the like, it is possible to finely adjust the ratio of the respective element components including the Si component, the O component and the C component, in the SiOC layer, namely the Si concentration, the O concentration and the C concentration in the SiOC layer. This makes it possible to accurately control the composition ratio of the SiOC film.

In the case of performing the set a plurality of times, the expression "a specified gas being supplied to the wafer 200" appearing in the respective steps of at least the second and subsequently performed sets means "a specified gas being supplied to the layer formed on the wafer 200, namely the uppermost surface of the wafer 200 as a laminate". Moreover, the expression "a specified layer being formed on the wafer 200" means "a specified layer being formed on the layer formed on the wafer 200, namely the uppermost surface of the wafer 200 as a laminate". These definitions are the same as described above. These definitions hold true in the case where a set or a cycle is performed a plurality of times in the modified examples and other embodiments described later.

(SiOC Film Modifying Process)

The SiOC film formed in the aforementioned manner is a film formed under a low temperature condition of, e.g., 150 degrees C. or less. The SiOC film has a superior etching resistance and a low dielectric constant. However, it is sometimes the case that the SiOC film is inferior in ashing resistance and further that the etching resistance of the SiOC film is impaired by the ashing performed through the use of $O_2$ plasma or the like. In the meantime, a thin film such as the SiOC film or the like often requires such optical characteristics that the thin film has a predetermined refractive index or attenuation coefficient (absorption coefficient) with respect to the light transmitting the thin film.

In the present embodiment, a thin film having a high ashing resistance and superior optical characteristics is formed by performing a step in which the SiOC film is modified to a SiOC film containing B by a $BCl_3$ gas as a modifying gas.

(Pressure Adjustment and Temperature Adjustment)

While feedback-controlling the APC valve 244, the interior of the process chamber 201 is vacuum-exhausted by the vacuum pump 246 so that the internal pressure of the process chamber 201 can reach a desired pressure (a desired vacuum level) (pressure adjustment). Furthermore, the wafers 200 existing within the process chamber 201 is heated by the heater 207 to a desired temperature. At this time, the electrical conduction state to the heater 207 is feedback-controlled based on the temperature information detected by the temperature sensor 263 such that the interior of the process chamber 201 has a desired temperature distribution (temperature adjustment). In this step, the boat 217 and the wafers 200 are continuously rotated by the rotary mechanism 267.

($BCl_3$ Gas Supply)

The valve 243d is opened and a $BCl_3$ gas is allowed to flow through the gas supply pipe 232d. The flow rate of the $BCl_3$ gas is regulated by the MFC 241d. The $BCl_3$ gas is supplied from the gas supply holes 250d into the buffer chamber 237 and then from the gas supply holes 250e into the process chamber 201, and is exhausted from the exhaust pipe 231. In this way, the $BCl_3$ gas is supplied to the wafers 200 ($BCl_3$ gas supply). At the same time, the valve 243j is opened and an inert gas such as an $N_2$ gas or the like is allowed to flow through the gas supply pipe 232j. The flow rate of the $N_2$ gas is regulated by the MFC 241j. The $N_2$ gas is supplied into the process chamber 201 together with the $BCl_3$ gas and is exhausted from the exhaust pipe 231.

In order to prevent the $BCl_3$ gas from entering the nozzles 249a to 249c, the valves 243g to 243i are opened and an $N_2$ gas is allowed to flow through the gas supply pipes 232g to 232i. The $N_2$ gas is supplied into the process chamber 201 through the gas supply pipes 232a to 232c and the nozzles 249a to 249c and is exhausted from the exhaust pipe 231.

At this time, the APC valve 244 is appropriately adjusted such that the internal pressure of the process chamber 201 is kept, e.g., less than an atmospheric pressure, specifically in a range of 1 to 13330 Pa (0.0075 to 100 Torr), more specifically in a range of 133 to 2666 Pa (1 to 20 Torr), e.g., at 1333 Pa (10 Torr). The supply flow rate of the $BCl_3$ gas controlled by the MFC 241d is kept, e.g., in a range of 1 to 2000 sccm, specifically 10 to 1000 sccm. The supply flow rates of the $N_2$ gas controlled by the MFCs 241g to 241j are respectively kept, e.g., in a range of 100 to 10000 sccm. The time duration required in supplying the $BCl_3$ gas to the wafers 200 is set, e.g., in a range of 1 to 120 minutes, specifically 10 to 120 minutes.

At this time, the temperature of the heater 207 is set such that, for example, the temperature of the wafer 200 becomes higher than the temperature of the wafer 200 in the step of forming the aforementioned SiOC film. The temperature of the wafer 200 is set in a range of 200 degrees C. to 900 degrees C., specifically 200 degrees C. to 700 degrees C., more specifically 200 degrees C. to 600 degrees C., e.g., at 600 degrees C. This temperature range is decided in light of, e.g., the thermal load or the thermal budget of the wafer 200. That is to say, if the temperature of the wafer 200 exceeds 900 degrees C., the thermal load grows too large and may affect the electrical characteristics or the like of the semiconductor device formed on the wafer 200. By setting the temperature of the wafer 200 at 900 degrees C. or less, it becomes possible to restrain the thermal load from affecting the electrical characteristics or the like. More specifically, if the wafer 200, on which the SiOC film as a heat treatment target is formed, is used for a memory device, the wafer 200 can endure heat of about 900 degrees C. Even if the wafer 200 is used for a logic device, the wafer 200 can endure heat of about 700 degrees C. If the temperature of the wafer 200 is set at 600 degrees C. or less, it becomes easy to reliably avoid the thermal damage of a device structure or the like. On the other hand, if temperature of the wafer 200 is less than 200 degrees C., the SiOC film modifying effect gets reduced and the supply time of the $BCl_3$ gas, namely the modifying time, becomes longer, which leads to a decrease in productivity. By setting the temperature of the wafer 200 to 200 degrees C. or more, the modification of the SiOC film can be accelerated and the modifying time can be kept within a practical processing time. For that reason, the temperature of the wafer 200 may be set in a range of 200 degrees C. to 900 degrees C., specifically 200 degrees C. to 700 degrees C., more specifically 200 degrees C. to 600 degrees C.

The $BCl_3$ gas supplied into the process chamber 201 is thermally activated and is exhausted from the exhaust pipe 231. In this way, the thermally activated $BCl_3$ gas is supplied to the wafer 200. That is to say, the gas flowing into the process chamber 201 is the thermally activated $BCl_3$ gas. The BTCSM gas or the $H_2O$ gas does not flow into the process chamber 201. Accordingly, the $BCl_3$ gas is not subjected to a gas phase reaction and is supplied to the wafer 200 in an activated state. The $BCl_3$ gas reacts with at least a portion of the first thin film (SiOC film) formed on the wafer 200 by performing Steps 1a and 2a a predetermined number of times. Thus, the SiOC film is thermally modified under a non-plasma atmosphere and is converted to a second thin film containing Si, O, C and B, namely an SiOC film containing B.

At this time, the temperature of the wafer 200 is kept relatively high as mentioned above. Therefore, the reaction of the $BCl_3$ gas and the SiOC film is accelerated and the B component can be introduced into the SiOC film. Furthermore, the temperature of the wafer 200 is set higher than the temperature of the wafer 200 used in the step of forming the SiOC film. Therefore, as described above, if the SiOC film contains a large amount of water, the water is easily desorbed from the film. Fine pores, i.e., small spaces, are generated in the portions of the SiOC film from which water is removed. Thus, the SiOC film becomes a porous film. B enters each of the pores from which water is removed, whereby the B component is easily introduced into the SiOC film. Consequently, the SiOC film is modified substantially over the entirety thereof. At this time, at least some of the B introduced into the SiOC film may form bonding with a component of the film, e.g., form Si—B bondings with Si or the like.

The modifying process of the SiOC film is performed, e.g., in a state where the temperature of the wafer 200 is increased to a desired temperature by the aforementioned temperature adjustment and then stably maintained at the desired temperature. The modifying process of the SiOC film may be started by starting the supply of the $BCl_3$ gas to the wafer 200 at an arbitrary timing while increasing the temperature of the wafer 200 in the step of adjusting the temperature of the wafer 200. Further, the reduction of the temperature of the wafer 200 performed in the below-mentioned step of purging the interior of the process chamber 201 may be started during the supply of the $BCl_3$ gas, and the modifying process of the SiOC film may be continuously performed while reducing the temperature of the wafer 200. Accordingly, the modifying process of the SiOC film essentially denotes the period during which the $BCl_3$ gas is supplied to the wafer 200 while maintaining the temperature of the wafer 200 at a predetermined temperature. At this time, the supply of the $BCl_3$ gas may be performed during at least partial periods of the step of adjusting (increasing) the temperature of the wafer 200 and the step of reducing the temperature of the wafer 200, whereby the periods may be included in the step of modifying the SiOC film. The desired temperature adjusted as above refers to the temperature suitable for introducing B into the SiOC film. Accordingly, for example, if the temperature available during the increase or reduction of the temperature of the wafer 200 is lower than the desired temperature, the introduction of B into the SiOC film is restricted or does not occur at all, whereby it is sometimes the case that the modifying process seldom occurs. It is therefore desirable that the modifying process be performed at a specific temperature by maintaining the wafer 200 at the desired temperature. By doing so, the speed and amount of the introduction of B into the SiOC film is stabilized and a thin film having a good quality and stable characteristics is obtained.

If the SiOC film is modified to an SiOC film containing B in the aforementioned manner, it is possible to obtain a thin film having a high ashing resistance. Furthermore, if B is contained in the SiOC film, the refractive index and attenuation coefficient of the thin film with respect to the light transmitting the thin film becomes higher. This makes it possible to obtain a thin film having superior optical characteristics. By adjusting the internal pressure of the process chamber 201, the temperature of the wafer 200, the supply flow rate and supply time of the $BCl_3$ gas, and the like during the supply of the $BCl_3$ gas, it is possible to control the concentration of B contained in the thin film and to accurately control the optical characteristics of the thin film.

(Residual Gas Removal and Purge)

Thereafter, the valve 243d is closed to stop the supply of the $BCl_3$ gas. At this time, the APC valve 244 of the exhaust pipe 231 is opened and the interior of the process chamber 201 is vacuum-exhausted by the vacuum pump 246, whereby the unreacted or reaction-contributed $BCl_3$ gas and the reaction byproducts remaining within the process chamber 201 are removed from the interior of the process chamber 201 (residual gas removal). Moreover, the valves 243g to 243j are opened and the supply of the $N_2$ gas as the inert gas into the process chamber 201 is maintained. The $N_2$ gas acts as a purge gas. This makes it possible to increase the effect of removing the unreacted $BCl_3$ gas or the $BCl_3$ gas contributed to the modification of the SiOC film and the reaction byproducts remaining within the process chamber 201 from the interior of the process chamber 201 (purge).

At this time, the gas remaining within the process chamber 201 may not be completely removed and the interior of the process chamber 201 may not be completely purged. If the amount of the gas remaining within the process chamber 201 is small, the return to the atmospheric pressure performed thereafter can be safely carried out. The flow rate of the $N_2$ gas supplied into the process chamber 201 need not be made large. For example, by supplying the $N_2$ gas in an amount substantially equal to the volume of the reaction tube 203 (the process chamber 201), it is possible to perform purging such that the $N_2$ gas does not adversely affect the return to the atmospheric pressure. By not completely purging the interior of the process chamber 201 in this manner, it is possible to shorten the purge time and to enhance the throughput. It is also possible to reduce the consumption of the $N_2$ gas to a necessary minimum amount.

As the modifying gas containing the specified Group III or Group V element, it is possible to use a gas containing B as a Group III element, which includes not only the $BCl_3$ gas but also a haloborane-based gas such as a monochloroborane ($BClH_2$) gas, a dichloroborane ($BCl_2H$) gas, a trifluoroborane ($BF_3$) gas, a tribromoborane ($BBr_3$) gas or the like and a borane-based gas such as a monoborane ($BH_3$) gas, a diborane ($B_2H_6$) gas or the like. As the inert gas, it may be possible to use not only the $N_2$ gas but also various types of rare gases mentioned earlier.

(Return to Atmospheric Pressure)

Even after the interior of the process chamber 201 is purged with the inert gas, the valves 243g to 243j are kept in an open state and the $N_2$ gas as the inert gas is continuously supplied from the gas supply pipes 232g to 232j into the process chamber 201. Thus, the atmosphere within the process chamber 201 is substituted by the inert gas (inert gas substitution) and the internal pressure of the process chamber 201 is returned to a normal pressure (return to atmospheric pressure).

The temperature of the wafer 200 is reduced such that the temperature of the wafer 200 becomes, e.g., less than 200 degrees C., specifically a temperature substantially equal to room temperature (temperature reduction step). That is to say, the temperature of the wafer 200 is reduced by adjusting the electrical conduction state to the heater 207 or stopping the supply of an electric current to the heater 207. By performing the reduction of the temperature of the wafer 200 in parallel with the purge and the return to atmospheric pressure, it is possible to reduce the temperature of the wafer 200 to a predetermined temperature within a short period of time using the cooling effect of the purge gas such as the $N_2$ gas or the like. As mentioned above, the temperature reduction step of reducing the temperature of the wafer 200 may be started during the period of the $BCl_3$ gas supply step.

(Boat Unloading and Wafer Discharging)

Thereafter, the seal cap 219 is lowered by the boat elevator 115 to open the lower end portion of the manifold 209. The processed wafers 200 are carried out of the reaction tube 203 through the lower end portion of the manifold 209 with the wafers 200 supported on the boat 217 (boat unloading). Then, the processed wafers 200 are discharged from the boat 217 (wafer discharging).

(3) EFFECTS OF THE PRESENT EMBODIMENT

The present embodiment provides one or more effects enumerated below.

(a) According to the film-forming sequence of the present embodiment, the BTCSM gas and the pyridine gas are supplied to the wafer 200 in Step 1a of the SiOC film forming process. By using the precursor gas containing Si, C and Cl and having an Si—C bonding, especially the precursor gas containing C, Cl and at least two Si in one molecule and having an Si—C bonding, in this manner, it is possible to introduce C into, e.g., an SiOC layer at a high concentration. Consequently, it becomes possible to form an SiOC film having a high C concentration.

In this regard, if an SiO film is obtained through the use of a catalytic gas under a low temperature condition, the wet etching rate (hereinafter also referred to as a WER) with respect to a hydrofluoric acid of 1% concentration (a 1% HF aqueous solution) is, e.g., about 600 Å/min. Even in an SiO film obtained through the use of plasma under a low temperature condition, the WER is, e.g., about 200 Å/min. In a thermally oxidized film obtained by thermally oxidizing a silicon wafer within an oxidizing furnace, the WER is, e.g., about 60 Å/min. This means that the WER of the SiO film formed under a low temperature condition is at least three times higher than the WER of the thermally oxidized film. The higher WER indicates that the etching resistance of the SiO film is inferior to, e.g., the thermally oxidized film. In order to enhance the etching resistance, an SiO film containing C, namely an SiOC film may be used.

In this case, if film formation is performed at a relatively high temperature, the SiOC film can be formed, e.g., in the following method. That is to say, there are provided a step of forming an Si-containing layer using a hexachlorodisilane ($Si_2Cl_6$, abbreviation: HCDS) gas or the like, a step of oxidizing the Si-containing layer with an oxidizing gas to convert the Si-containing layer to a silicon oxide layer (SiO layer), and a step of exciting a hydrocarbon-based gas, e.g., a propylene ($C_3H_6$) gas, with plasma and supplying the excited hydrocarbon-based gas to a wafer 200. Thus, C is introduced into the Si-containing layer or the SiO layer to form an SiOC layer. Consequently, it becomes possible to form an SiOC film. However, when film formation is performed at a relatively low temperature of, e.g., 150 degrees C. or less, as in the present embodiment, it is hard to introduce C into a layer, which makes it difficult to form an SiOC layer. That is to say, a sufficient C concentration is not obtained in a resultant thin film. It is sometimes the case that, for example, an SiO film containing little C and having a low etching resistance is formed.

Accordingly, in the present embodiment, the BTCSM gas is used as the precursor gas. Thus, in the step of forming a first layer as an initial layer on the wafer 200, C can be introduced into the first layer. It is therefore possible to form an SiOC film having a sufficient C concentration. It is also possible to accurately control the C concentration in the SiOC film. Accordingly, it is possible to obtain, e.g., an SiOC film having a high etching resistance and a low dielectric constant.

(b) According to the film-forming sequence of the present embodiment, the $BCl_3$ gas is supplied to the wafer 200 in the modifying process of the SiOC film, thereby modifying the SiOC film to an SiOC film containing B. Thus, it is possible to obtain a thin film having a high ashing resistance while maintaining the high etching resistance and the low dielectric constant of the SiOC film.

A certain SiOC film containing C therein has a low ashing resistance. Thus, it is sometimes the case that the etching resistance of the SiOC film is reduced by the ashing performed using $O_2$ plasma or the like. Presumably, this is because the SiOC film is further oxidized by the strong oxidizing power of the $O_2$ plasma or the like and because a large number of C—O bondings are formed in the SiOC film. C bonded to O becomes a CO gas or a $CO_2$ gas and is easily desorbed from the SiOC film. Accordingly, it is considered that the C concentration in the SiOC film is reduced by the ashing and the SiOC film is converted to a film having a low etching resistance.

In this connection, it is conceivable to use, e.g., a method in which a new element is introduced into an SiOC film, thereby suppressing the formation of C—O bondings in the SiOC film and enhancing the ashing resistance. As an element which can be easily introduced into the film, it may be possible to use, e.g., nitrogen (N). However, it is known that a thin film containing N, e.g., an SiOCN film, is higher in dielectric constant than, e.g., an SiOC film, and is lower in resistance to a hot phosphoric acid than the SiOC film.

Accordingly, in the present embodiment, B is introduced into the SiOC film by using the $BCl_3$ gas as the modifying gas. Thus, the boding states of Si, O and C in the modified film differ from those in the unmodified SiOC film, so that C—O bondings are hardly formed during the ashing performed using $O_2$ plasma or the like. It is also possible to restrain C from desorbing from the film. Therefore, as compared with, e.g., an SiOC film which is not subjected to the modifying process and does not contain B, it is possible to enhance the ashing resistance, namely the oxidizing resistance of the thin film. That is to say, it is possible to obtain, e.g., a thin film having a high ashing resistance without having to introduce N into the thin film and while maintaining the high etching resistance and the low dielectric constant of the SiOC film. This makes it possible to restrain the etching resistance of the thin film from deteriorating due to the ashing.

(c) According to the film-forming sequence of the present embodiment, in the SiOC film modifying process, the SiOC film is modified to an SiOC film containing B. Therefore, as compared with, e.g., an SiOC film which is not subjected to the modifying process and does not contain B, it is possible to increase the refractive index and the attenuation coefficient (absorption coefficient) of a thin film with respect to the light transmitting the thin film.

The thin film such as the SiOC film or the like is often used as, e.g., a hard mask. In this case, there is sometimes required superior optical characteristics that indicates a predetermined refractive index or a predetermined attenuation coefficient with respect to the light transmitting a film. For example, a multi-layer hard mask is widely used in the state-of-the-art devices that grow finer and finer. In a photolithography process, a technique of accurately overlapping a resist pattern on a partially patterned multi-layer hard mask or a base film thereof becomes important. The overlapping of the resist pattern is performed by, e.g., allowing laser light to transmit through a multi-layer hard mask and confirming an alignment mark formed in a base film or the like. Accordingly, the refractive index, attenuation coefficient, thickness and the like of each of the layers are thoroughly defined in order to suppress the reflection or attenuation (absorption) of the laser light in the respective layers constituting the multi-layer hard mask.

In the present embodiment, the refractive index and the attenuation coefficient can be controlled to become desired values by adjusting the B concentration in the SiOC film containing B. That is to say, it is possible to obtain a thin film having superior optical characteristics, i.e., high controllability of the refractive index and the attenuation coefficient. Accordingly, if this thin film is applied to, e.g., a multi-layer hard mask, it is possible to enhance the position alignment accuracy of a resist pattern. It is also possible to broaden the range of combinations of the respective layers of the multi-layer hard mask depending on the desired optical characteristics.

Transistors or an RRAM (registered trademark) and an MRAM as next generation memories are being developed. A thin film used in these next generation memories is required to satisfy the low temperature deposition, the low WER (high etching resistance), the low dielectric constant, and so forth. Often used as this thin film is a thin film, e.g., a silicon carbon nitride film (SiCN film) obtained by adding C to a silicon nitride film (SiN film) or a silicon oxycarbon nitride film (SiOCN film) obtained by further adding O to the silicon carbon nitride film. In order to further enhance the etching resistance of these thin films and to further reduce the dielectric constant thereof, it is necessary to increase the C concentration or the O concentration in the film while reducing the N concentration. However, in the aforementioned method in which a film is formed in the low temperature region by, e.g., alternately supplying different types of gases, it is difficult to reduce the N concentration to, e.g., an impurity level, and to have C contained in the film at a high concentration.

In the present embodiment, when forming the SiOC film, the process is performed at a low temperature of, e.g., 150 degrees C. or less. Even under this low temperature condition, the C concentration in the thin film can be increased or accurately controlled by using the precursor gas having an Si—C bonding. Since the SiOC film is modified to an SiOC film containing B by performing the SiOC film modifying process, the C concentration in the film can be kept high, e.g., even after ashing.

(4) MODIFIED EXAMPLES OF THE PRESENT EMBODIMENT

Figure 5B:
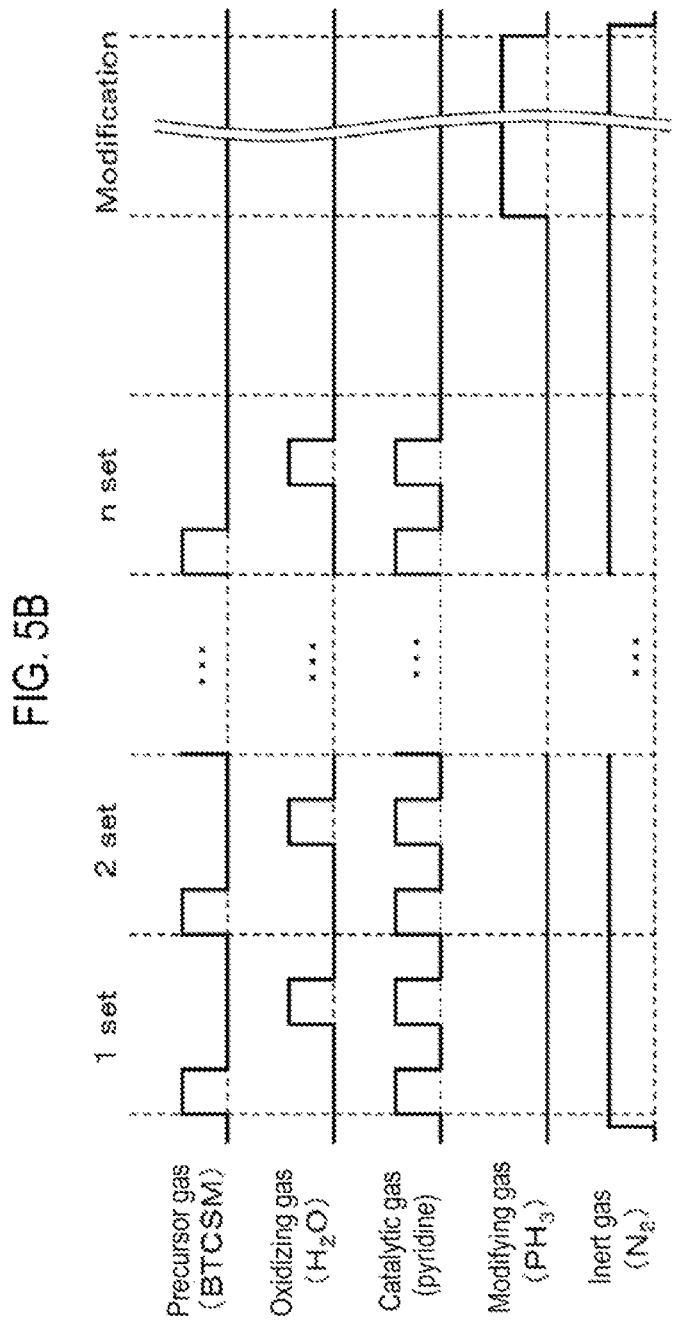
FIG. 5B is a view showing a modified example thereof.

Next, certain modified examples of the present embodiment will be described with reference to FIGS. 5B and 7.

Modified Example

In the SiOC film modifying process described above, for example, an element other than B can be selected as the element to be contained in the SiOC film by selecting the type of the modifying gas as supplied.

That is to say, in the SiOC film modifying process, an element to be contained in the SiOC film can be selected by selecting a specific modifying gas from different types of modifying gases containing different elements, e.g., by selecting a gas containing a specific Group III or Group V element from different types of modifying gases containing different Group III or Group V elements, and supplying the selected gas as the modifying gas.

In order to select a specific modifying gas from different types of modifying gases and to supply the selected modifying gas, a specific supply line is selected from a plurality of supply lines for supplying different types of modifying gases containing different specified elements or for supplying different types of modifying gases differing in molecular structure. As described above, in the example of the film-forming sequence shown in FIGS. 4 and 5A, the BCl₃ gas supply line is selected from the BCl₃ gas supply line and the PH₃ gas supply line, whereby the BCl₃ gas is supplied as a specific modifying gas. As shown in FIG. 5B, in the film-forming sequence of the modified example of the present embodiment, the PH₃ gas supply line is selected from the BCl₃ gas supply line and the PH₃ gas supply line, whereby the PH₃ gas is supplied as a specific modifying gas. If the PH₃ gas rather than the BCl₃ gas is used as the modifying gas in this manner, it is possible to obtain an SiOC film containing P, which differs from the SiOC film containing B obtained in the aforementioned embodiment. In this regard, the SiOC film containing P may be referred to as an SiOC film doped (added) with P or may be called a silicon oxycarbon phosphide film (SiOCP film) or a silicon oxyphosphorus carbide film (SiOPC film).

In the present modified example, an SiOC film is formed on the wafer 200 by performing the same steps as the aforementioned Steps 1a and 2a a predetermined number of times. Thereafter, an SiOC film modifying process including a step of supplying a PH₃ gas to the wafer 200 in place of the aforementioned BCl₃ gas supply step is performed. The procedures of supply of the PH₃ gas to the wafer 200 will be described below.

(PH₃ Gas Supply)

The valve 243e is opened and the PH₃ gas is allowed to flow through the gas supply pipe 232e. The flow rate of the PH₃ gas is regulated by the MFC 241e. The PH₃ gas is supplied from the gas supply holes 250d into the buffer chamber 237 and is then supplied from the gas supply holes 250e into the process chamber 201. The PH₃ gas is exhausted from the exhaust pipe 231. In this way, the PH₃ gas is supplied to the wafers 200 (PH₃ gas supply). At the same time, the valve 243j is opened and an inert gas such as an N₂ gas or the like is allowed to flow through the gas supply pipe 232j. The flow rate of the N₂ gas is regulated by the MFC 241j. The N₂ gas is supplied into the process chamber 201 together with the PH₃ gas and is exhausted from the exhaust pipe 231.

The PH₃ gas supplied into the process chamber 201 is thermally activated and is exhausted from the exhaust pipe 231. In this way, the thermally activated PH₃ gas is supplied to the wafer 200. That is to say, the gas flowing into the process chamber 201 is the thermally activated PH₃ gas. The BTCSM gas or the H₂O gas does not flow into the process chamber 201. Accordingly, the PH₃ gas is not subjected to a gas phase reaction and is supplied to the wafer 200 in an activated state. The PH₃ gas reacts with at least a portion of the SiOC film formed on the wafer 200 by performing the same steps as Steps 1a and 2a a predetermined number of times. Thus, the SiOC film is thermally modified under a non-plasma atmosphere and is converted to a thin film containing Si, O, C and P, namely an SiOC film containing P.

At this time, the temperature of the wafer 200 is kept relatively high. Therefore, the reaction of the PH₃ gas and the SiOC film is accelerated and the P component can be introduced into the SiOC film. Furthermore, the temperature of the wafer 200 is set higher than the temperature of the wafer 200 used in the step of forming the SiOC film. Therefore, if the SiOC film contains a large amount of water, the water is easily desorbed from the film. Fine pores are generated in the portions of the SiOC film from which water is removed. Thus, the SiOC film becomes a porous film. P enters each of the pores from which water is removed, whereby the P component is easily introduced into the SiOC film. Consequently, the SiOC film is modified substantially over the entirety thereof. At this time, at least some of the P introduced into the SiOC film may form bondings with a component of the film, e.g., form Si—P bondings with Si or the like.

By modifying the SiOC film to an SiOC film containing P in this manner, it is possible to obtain a thin film having a high ashing resistance. Due to the inclusion of P in the SiOC film, the refractive index and attenuation coefficient of the thin film with respect to the transmitting light becomes higher. This makes it possible to obtain a thin film having superior optical characteristics. The concentration of P contained in the film can be controlled and the optical characteristics of the thin film can be accurately controlled by adjusting the internal pressure of the process chamber 201 and the temperature of the wafer 200 during the supply of the PH₃ gas and the supply flow rate and supply time of the PH₃ gas.

After the SiOC film is modified to the SiOC film containing P, the valve 243e is closed to stop the supply of the PH₃ gas.

At this time, the processing conditions such as the internal pressure of the process chamber 201, the supply flow rate and supply time of the respective gases such as the modifying gas or the N₂ gas, the temperature of the wafer 200, and so forth may be set, e.g., within the same extent as the processing conditions of the aforementioned embodiment. When supplying the PH₃ gas, as with the aforementioned embodiment, the N₂ gas supply is performed to prevent the gas from entering the nozzles 249a to 249c not in use.

As the modifying gas containing the specified Group III or Group V element, it is possible to use a gas containing P as a Group V element, which includes not only the phosphine (PH₃) gas but also a phosphine-based gas such as a diphosphine (P₂H₄) gas or the like and a halophosphine-based gas such as chlorophosphine (PClH₂) gas, a dichlorophosphine (PCl₂H) gas, a trichlorophosphine (PCl₃) gas, a trifluorophosphine (PF₃) gas, a tribromophosphine (PBr₃) gas or the like. As the inert gas, it may be possible to use not only the N₂ gas but also various types of rare gases mentioned earlier.

As described above, in the SiOC film modifying process, the P-containing gas in place of the B-containing gas is supplied to the wafer 200, whereby the SiOC film containing P in place of B is obtained. The method in which the composition of a film is changed by changing the types of gases supplied to the wafer 200 may be applied to, e.g., the SiOC film forming process.

In the aforementioned step of supplying the precursor gas and the first catalytic gas, the concentration of C in the SiOC layer and in the SiOC film formed by laminating the SiOC layers can be controlled by appropriately selecting the type of the precursor gas as supplied. That is to say, in the step of supplying the precursor gas and the first catalytic gas, the concentration of C in the SiOC layer or the SiOC film can be controlled by selecting a specific precursor gas from different types of process gases differing in molecular structure and supplying the selected gas as the precursor gas.

It is considered that one factor that makes it possible to control the concentration of C in the SiOC film depending on the type of the selected precursor gas is, for example, a difference in arrangement of C in molecular structures of the respective precursor gases. The BTCSM gas or the BTCSE gas as an alkylenehalosilane-based precursor gas having an Si—C—Si bonding or an Si—C—C—Si bonding in one molecule has a molecular structure in which C is interposed between Si and Si. As a result, a large number of Cl is kept bonded to bonding electrons of the remaining Si. For example, in the BTCSM gas and the BTCSE gas, Cl is bonded to three of four bonding electrons of Si. It is considered that a large number of Cl included in the molecule serves to enhance the reactivity of the BTCSM gas and the BTCSE gas. Thus, the film forming rate of, e.g., the SiOC film, is increased by using the BTCSM gas and the BTCSE gas. Since the reactivity and film forming rate of the BTCSM gas or the BTCSE gas is increased by the inclusion of Cl, the available condition range (process window) of the film-forming process performed through the use of the BTCSM gas or the BTCSE gas is expanded. In this manner, the film-forming conditions for obtaining, e.g., a desired C concentration can be selected from within the broad process window. Consequently, it becomes easy to increase the C concentration in the SiOC film. It is also possible to enhance the controllability of the C concentration in the SiOC film. The number of C contained in the BTCSM gas is smaller than that in, e.g., the TCDMDS gas. However, it is considered that this does not disadvantageously act in increasing the C concentration in the SiOC film. The present inventors have confirmed that the C concentration can be increased more easily when using, e.g., the BTCSM gas, than when using the TCDMDS gas.

The TCDMDS gas or the DCTMDS gas, as an alkylhalosilane-based precursor gas in which an alkyl group such as a methyl group or the like is bonded to Si, has a molecular structure in which some chloro groups of the chlorosilane-based precursor gas are substituted by methyl groups. When using the TCDMDS gas or the DCTMDS gas, the reaction occurs relatively slow just as much as the decrease of the number of Cl in a gas molecule. This makes it easy to obtain a dense SiOC film. Thus, it is easy to maintain a high etching resistance even in the case of, e.g., an SiOC film whose C concentration is appropriately suppressed. Comparison of the TCDMDS gas and the DCTMDS gas reveals that the DCTMDS gas containing the larger number of methyl groups, i.e., C, acts more advantageously in introducing C into the film.

Similarly, in the step of supplying the oxidizing gas and the second catalytic gas, the type of the catalytic gas supplied can be appropriately selected depending on the desired film composition or the like. For instance, it is considered that catalytic gases having different molecular structures differ in, e.g., the intensity of catalytic actions. It is presumed that the difference in the intensity of catalytic actions is one factor that makes it possible to control the composition or the like of the SiOC film through the selection of the type of the catalytic gas. For example, if a catalytic gas having a large pKa value, as an index of a catalytic action, is selected, the oxidizing power of the oxidizing gas is increased and the Si—C bonding is broken. It is sometimes the case that the tendency of a decrease in the C concentration becomes stronger. On the contrary, if a catalytic gas having a small pKa value is selected, the oxidizing power of the oxidizing gas is reduced and the Si—C bonding is maintained. It is sometimes the case that the tendency of an increase in the C concentration becomes stronger. Other factors that make it possible to control the composition or the like of the SiOC film include a difference in vapor pressures of different materials involved in a catalytic reaction such as various types of catalytic gases, salts generated and the like, and a composite factor resulting from the combination of differences in pKa values and the vapor pressures of such materials. As mentioned above, the concentration of C in, e.g., the SiOC layer or the SiOC film, can be controlled by selecting a specific catalytic gas from a plurality of catalytic gases differing in molecular structure and supplying the selected catalytic gas.

The type of the catalytic gas supplied in the step of supplying the oxidizing gas and the catalytic gas may be identical with or different from the type of catalytic gas supplied in the step of supplying the precursor gas and the catalytic gas.

By selecting the type of the precursor gas or the catalytic gas, the Si concentration and the O concentration may be relatively changed through the control of the concentration of C in the SiOC film. In other words, the type of the precursor gas or the catalytic gas may be selected in order to change or control the composition of the SiOC film as a whole.

If the set including Steps 1a and 2a is performed a plurality of times, the type of the precursor gas or the catalytic gas may be changed during the set. Moreover, if the set including Steps 1a and 2a is performed a plurality of times, the supply amount of the catalytic gas may be changed during the step. This makes it possible to change the concentration of C in the SiOC film in the film thickness direction.

As described above, the substrate processing apparatus according to the present embodiment and the modified example thereof is provided with a plurality of modifying gas supply lines, and is configured to select a specific modifying gas from different types of modifying gases including different specified elements or from different types of modifying gases differing in molecular structure and to supply the selected modifying gas. The substrate processing apparatus according to the present embodiment and the modified example thereof may be provided with a plurality of precursor gas supply lines or a plurality of catalytic gas supply lines, and may be configured to select a specific precursor gas or a specific catalytic gas from different types of precursor gases or catalytic gases differing in molecular structure and to supply the selected precursor gas or the selected catalytic gas. This makes it easy to select a specific modifying gas, a specific precursor gas or a specific catalytic gas from different types of gases depending on the desired film composition and to supply the selected gas. Accordingly, thin films of different composition ratios and different qualities can be formed by one substrate processing apparatus with increased versatility and reproducibility. In addition, it is possible to secure the degree of freedom of apparatus management when adding or replacing gas species.

In the substrate processing apparatus according to the present embodiment and the modified example thereof, a plurality of process recipes used in the formation of different types of thin films mentioned above (a plurality of programs defining processing sequences or processing conditions) may be prepared in advance in a corresponding relationship with the types of modifying gases, the precursor gases and the catalytic gases, namely the different gas systems. Furthermore, in the substrate processing apparatus according to the present embodiment and the modified example thereof, a plurality of process recipes may be prepared in a corresponding relationship with different processing conditions. This makes it easy to select a specific modifying gas, a specific precursor gas or a specific catalytic gas from different types of gases depending on the desired film composition and to supply the selected gas. In order to perform a film-forming process, it is only necessary for an operator to appropriately select a proper process recipe from a plurality of process recipes depending on the desired film composition. Accordingly, thin films of different composition ratios and different qualities can be formed by one substrate processing apparatus with increased versatility and reproducibility. It is also possible to alleviate the operation burden (such as the input burden of processing sequences and processing conditions) borne by an operator. This makes it possible to rapidly start the substrate processing while avoiding an operational error.

Another Modified Example

In the aforementioned embodiment, the SiOC film forming process and the SiOC film modifying process are performed in a state where the wafers 200 to be processed are accommodated within the same process chamber 201. In the present modified example, the SiOC film forming process and the SiOC film modifying process are performed in a state where the wafers 200 to be processed are accommodated within different process chambers.

Figure 7A:
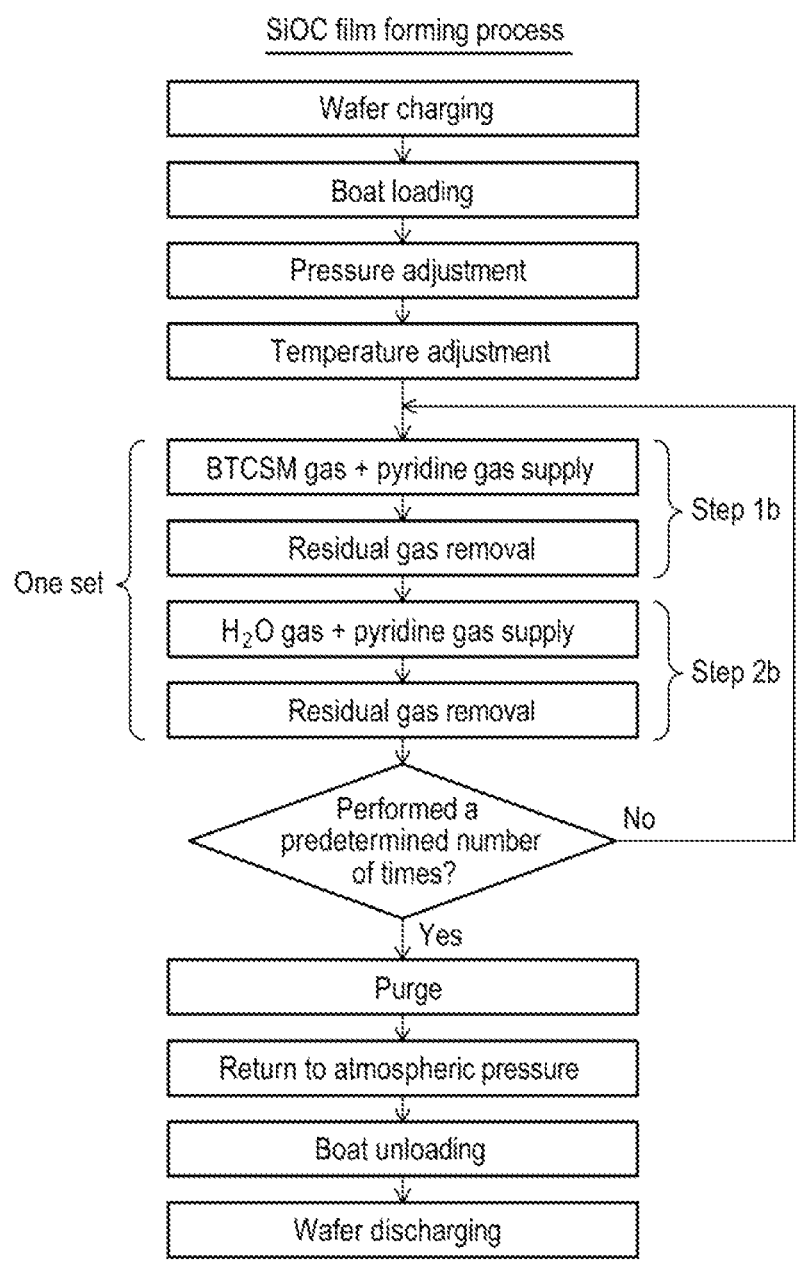
FIGS. 7A and 7B are views of a film-forming flow in a film-forming sequence of a modification of the first embodiment of the present disclosure, FIG. 7A showing an SiOC film forming process and FIG. 7B showing an SiOC film modifying process.
Figure 7B:
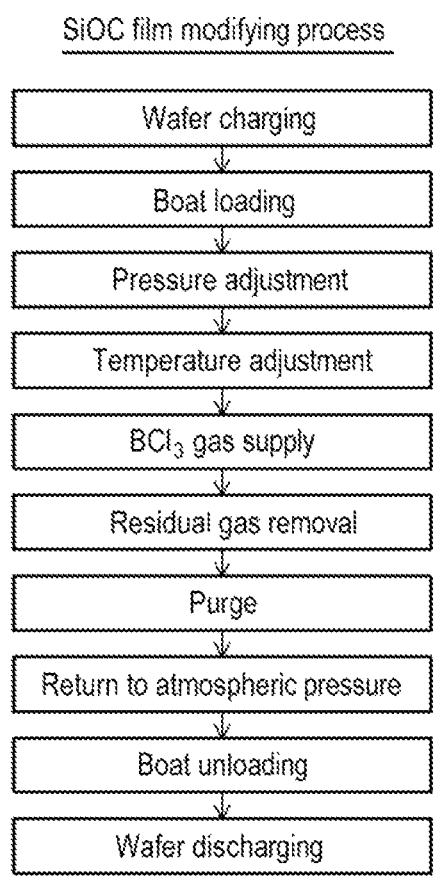

As shown in FIG. 7, for example, an SiOC film forming process is performed within the process chamber 201 (hereinafter also referred to as a first process chamber) of the substrate processing apparatus (hereinafter also referred to as a first substrate processing apparatus) shown in FIGS. 1 and 2 as is the case in the aforementioned embodiment. The operations of the respective parts constituting the first substrate processing apparatus are controlled by the controller 121 (hereinafter also referred to as a first control part). A set including Steps 1b and 2b identical with the aforementioned Steps 1a and 2a is performed a predetermined number of times. Thereafter, the purge of the process chamber 201, the return to the atmospheric pressure, the boat unloading and the wafer discharging are performed one after another.

Subsequently, a process for modifying the SiOC film formed on the wafer 200 discharged from the boat 217 is performed within a process chamber other than the process chamber 201. As this process chamber, it is possible to use a process chamber (hereinafter also referred to as a second process chamber) of a substrate processing apparatus (hereinafter also referred to as a second substrate processing apparatus) having the same configuration to that of, e.g., the substrate processing apparatus of the aforementioned embodiment but different than the substrate processing apparatus that performs the SiOC film forming process. The operations of the respective parts constituting the second substrate processing apparatus are controlled by a second control part. In the second substrate processing apparatus, as in the first substrate processing apparatus of the aforementioned embodiment, the wafer charging and the boat loading are performed one after another. As with the SiOC film modifying process of the aforementioned embodiment, the pressure adjustment, the temperature adjustment, the $BCl_3$ gas supply and the residual gas removal are performed. Thereafter, as with the aforementioned embodiment, the purge, the return to the atmospheric pressure, the boat unloading and the wafer discharging are performed one after another.

In the aforementioned case, a substrate processing system is mainly made up of the first substrate processing apparatus for forming the SiOC film and the second substrate processing apparatus for modifying the SiOC film.

As described above, the SiOC film forming process and the SiOC film modifying process may be performed within the same process chamber 201 (in-situ) or may be performed within different process chambers, e.g., the first process chamber and the second process chamber (ex-situ). If the two processes are performed in-situ, it is possible to consistently carry out the processing while preventing the wafers 200 from being exposed to the atmosphere on the way and while keeping the wafers 200 under a vacuum. Accordingly, it is possible to perform the film-forming process in a more stable manner. If the two processes are performed ex-situ, it is possible to preset the internal temperatures of the respective process chambers, e.g., equal to or close to the processing temperatures of the respective processes. This makes it possible to shorten the time required in the temperature adjustment. Accordingly, it is possible to further improve the manufacturing efficiency.

The process chamber for use in modifying the SiOC film may be a process chamber of an apparatus having a configuration different from that of the substrate processing apparatus of the aforementioned embodiment. For example, the process chamber may be a process chamber provided in a heat treatment furnace used in heat treatment or a process chamber provided in a diffusion furnace for performing diffusion.

Second Embodiment

Next, a second embodiment of the present disclosure will be described.

(1) Thin Film Forming Process

In the aforementioned embodiment, the set including Steps 1a and 2a is performed a predetermined number of times to form the SiOC film which in turn is modified by the modifying gas. In the present embodiment, a cycle in which an SiOC layer formed by Steps 1c and 2c just like the aforementioned Steps 1a and 2a is modified to an SiOC layer containing a specified element is performed a predetermined number of times to form an SiOC film containing the specified element. In the present embodiment, as with the aforementioned embodiment, the substrate processing apparatus shown in FIGS. 1 and 2 is used. In the following description, the operations of the respective parts constituting the substrate processing apparatus are controlled by the controller 121.

Figure 8:
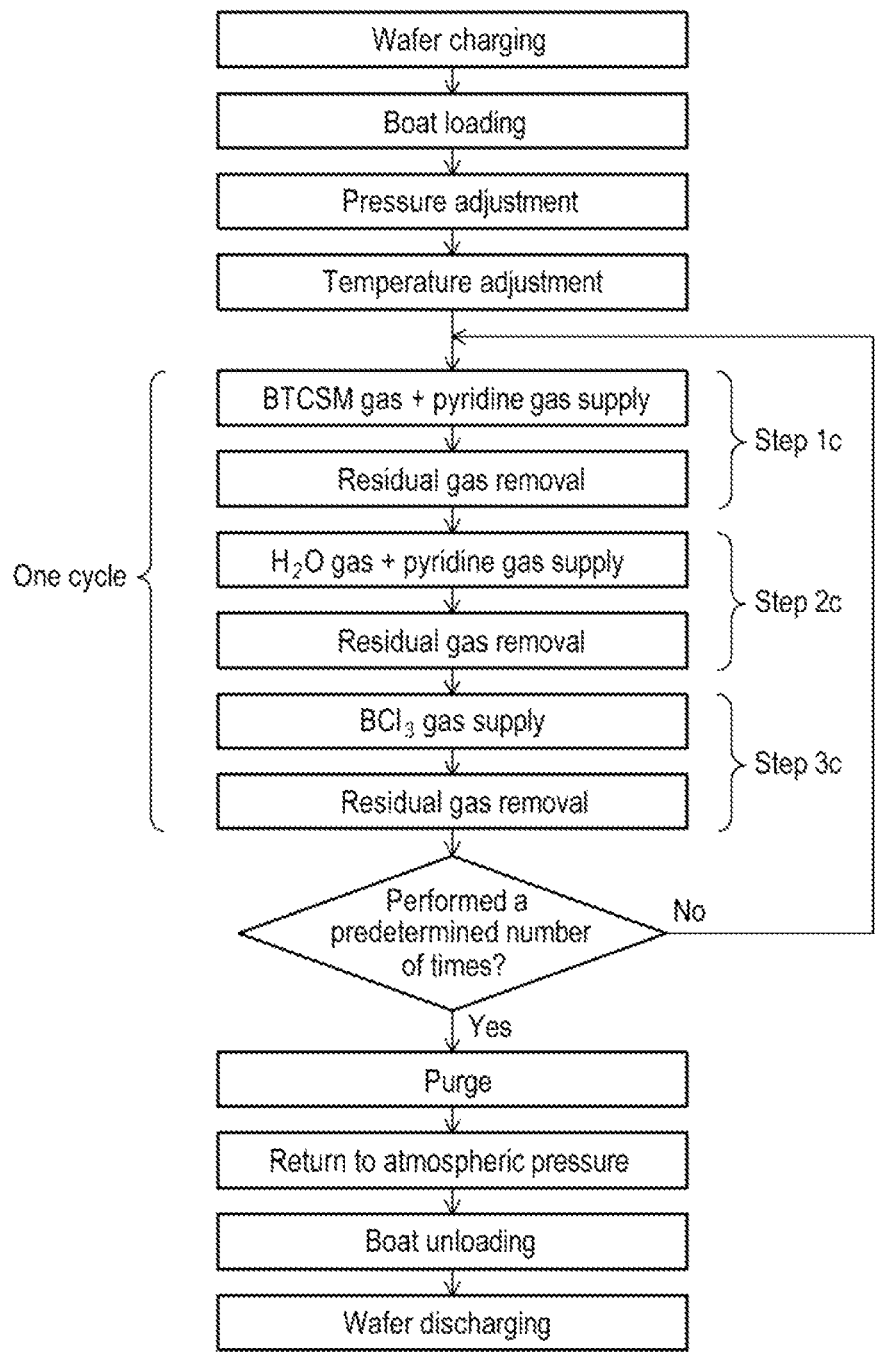
FIG. 8 is a view showing a film-forming flow in a film-forming sequence of a second embodiment of the present disclosure.

As shown in FIGS. 8 and 9A, in the present embodiment, description will be made on an example where a cycle which sequentially performs: a step of supplying a BTCSM gas as a precursor gas and a pyridine gas as a first catalytic gas to the wafer 200 (Step 1c); a step of supplying an $H_2O$ gas as an oxidizing gas and a pyridine gas as a second catalytic gas to the wafer 200 (Step 2c); and a step of supplying a $BCl_3$ gas as a modifying gas to the wafer 200 (step 3c), is performed a predetermined number of times to form an SiOC film containing B as a thin film containing Si, O, C and B on the wafer 200.

At this time, in the step of supplying a $BCl_3$ gas to the wafer 200, a $BCl_3$ gas in a plasma-excited state is supplied to the wafer 200.

The present sequence differs from the film-forming sequence of the aforementioned embodiment only in Step 3c of supplying the $BCl_3$ gas in the plasma-excited state and in the processing order of the respective steps including Step 3c. Individual Steps 1c and 2c other than Step 3c remain the same as those of the aforementioned embodiment. Description will now be made on Step 3c of the present embodiment and the processing order of the respective steps including Step 3c.

[Step 3c]

($BCl_3$ Gas Supply)

After Step 2c is finished and the gas remaining within the process chamber 201 is removed, the valve 243d is opened and a $BCl_3$ gas is allowed to flow through the gas supply pipe 232d. The flow rate of the $BCl_3$ gas is regulated by the MFC 241d. The $BCl_3$ gas is supplied from the gas supply holes 250d into the buffer chamber 237. At this time, a radio-frequency (RF) power is applied from the high-frequency power supply 273 to between the rod-shaped electrodes 269 and 270 through the matching unit 272, whereby the $BCl_3$ gas supplied into the buffer chamber 237 is plasma-excited. The BCl3 gas as an active species is supplied from the gas supply holes 250e into the process chamber 201 and is exhausted from the exhaust pipe 231. In this way, the plasma-activated (excited) $BCl_3$ gas is supplied to the wafer 200 ($BCl_3$ gas supply). At the same time, the valve 243f is opened and an Ar gas is allowed to flow through the gas supply pipe 232f. The flow rate of the Ar gas is regulated by the MFC 241f. The Ar gas is supplied into the process chamber 201 together with the $BCl_3$ gas and is exhausted from the exhaust pipe 231. When supplying the respective gases, as with the aforementioned embodiment, the $N_2$ gas supply is appropriately performed to prevent the gases from entering the nozzles 249a to 249c not in use at that time.

At this time, the APC valve 244 is appropriately adjusted such that the internal pressure of the process chamber 201 is kept, e.g., less than atmospheric pressure, specifically in a range of 1 to 13330 Pa (0.0075 to 100 Torr), more specifically in a range of 133 to 2666 Pa (1 to 20 Torr), e.g., at 1333 Pa (10 Torr). The supply flow rate of the $BCl_3$ gas controlled by the MFC 241d is kept, e.g., in a range of 1 to 2000 sccm, specifically 10 to 1000 sccm. The supply flow rate of the Ar gas controlled by the MFC 241f and the supply flow rates of the $N_2$ gas controlled by the MFCs 241g to 241i are respectively kept, e.g., in a range of 100 to 10000 sccm. The time duration required in supplying the $BCl_3$ gas to the wafers 200 is set, e.g., in a range of 1 to 100 seconds, specifically 5 to 60 seconds.

The temperature of the heater 207 is set such that the temperature of the wafer 200 is kept in the same temperature range as the temperature of the wafer 200 in Steps 1c and 2c, e.g., in a range of from room temperature to 150 degrees C., specifically from room temperature to 100 degrees C., more specifically from 50 degrees C. to 100 degrees C. The radio-frequency power supplied from the high-frequency power supply 273 to between the rod-shaped electrodes 269 and 270 is set, e.g., in a range of 50 to 1000 W.

The gas flowing into the process chamber 201 is the plasma-excited $BCl_3$ gas which includes active species, e.g., B radicals (B*). The BTCSM gas or the $H_2O$ gas does not flow into the process chamber 201. Accordingly, the $BCl_3$ gas is not subjected to a gas phase reaction and is supplied to the wafer 200 in an activated state. The SiOC layer as a second layer formed on the wafer 200 in Steps 1c and 2c is modified primarily by the active species. As with the aforementioned embodiment, the energy of the active species is higher than the energy of the thermally activated $BCl_3$ gas. For that reason, if the energy of the active species is applied to the SiOC layer, the Si—O bondings and the Si—C bondings included in the SiOC layer are at least partially broken. The B* as active species is bonded to the remaining bonding electrons of Si whose bonding with O or C is broken. It is considered that at least some of the B introduced into the SiOC layer makes Si—B bondings. Moreover, some of the B in the layer may be bonded to the remaining bonding electrons of O or C to make B—O bondings or B—C bondings. In this way, the SiOC layer as the second layer is changed (modified) to a third layer containing B, namely an SiOC layer containing B.

The Ar gas supplied together with the $BCl_3$ gas is relatively low in ionization energy and is excited into a plasma state, whereby the Ar gas acts as an assist gas that assists in igniting plasma. If the radio-frequency power is applied from the high-frequency power supply 273 to between the rod-shaped electrodes 269 and 270 under the existence of the Ar gas as mentioned above, the $BCl_3$ gas is easily plasma-excited. At this time, for example, the supply of the Ar gas may be started prior to the supply of the $BCl_3$ gas. In other words, the radio-frequency power may be applied from the high-frequency power supply 273 to between the rod-shaped electrodes 269 and 270 while supplying the Ar gas alone, and then, in this state, the supply of the $BCl_3$ gas may be started. Consequently, the $BCl_3$ gas is supplied to the Ar gas atmosphere of plasma state within the buffer chamber 237. Thus, the $BCl_3$ gas is easily plasma-excited. Moreover, the Ar gas may act as an assist gas that assists in dissociating the $BCl_3$ gas in the plasma.

(Residual Gas Removal)

After the SiOC layer containing B as the third layer is formed on the wafer 200, the application of the radio-frequency power from the high-frequency power supply 273 to between the rod-shaped electrodes 269 and 270 is stopped. Furthermore, the valve 243d is closed to stop the supply of the $BCl_3$ gas. Moreover, the valve 243f is closed to stop the supply of the Ar gas. The supply of the Ar gas may not be stopped, and in this case, the Ar gas can serve as a purge gas for primarily purging the interior of the nozzle 249d or the interior of the buffer chamber 237. Alternatively, the supplied gas may be switched from the Ar gas to an $N_2$ gas so as to continuously purge the interior of the nozzle 249d or the interior of the buffer chamber 237. At this time, the removal of the residual gas from the process chamber 201 is performed in the same order as in the aforementioned embodiment.

As the modifying gas containing the specified Group III or Group V element, it may be possible to use not only the $BCl_3$ gas containing B as a Group III element but also one of the B-containing gases mentioned above or a P-containing gas containing P as a Group V element. As the assist gas that assists in igniting plasma, it may be possible to use not only the Ar gas but also a rare gas such as a He gas, a Ne gas, a Xe gas or the like, an $N_2$ gas, and so forth.

(Performing Predetermined Number of Times)

One cycle including Steps 1c, 2c and 3c described above is performed one or more times, namely a predetermined number of times (n times), whereby an SiOC film containing B and having a specified composition and a specified thickness can be formed on the wafer 200. The cycle may be repeated a plurality of times. That is to say, the thickness of an SiOC layer containing B formed every cycle may be set to be smaller than a desired film thickness and the cycle is repeated a plurality of times until the thickness of the SiOC film reaches the desired film thickness.

Thereafter, the purge, the return to the atmospheric pressure, the boat unloading and the wafer discharging are performed in the same order as in the aforementioned embodiment, thereby finishing the film-forming process of the present embodiment.

(2) Effects of the Present Embodiment

The present embodiment provides not only the same effects as provided in the aforementioned first embodiment but also one or more effects enumerated below.

(a) According to the film-forming sequence of the present embodiment, in Step 3c, the $BCl_3$ gas is supplied to the wafer 200 in a plasma-excited state. Thus, the BCl$_3$ gas is activated more than the thermally activated state. This makes it possible to significantly increase the modifying action of the BCl$_3$ gas with respect to the SiOC layer. B* as active species is readily introduced into the SiOC layer and is mostly bonded to Si or the like, whereby B* is contained in the SiOC layer in a robust and stable state. That is to say, the SiOC layer containing B obtained by the modifying process can be made to be a robust and stable layer including a large number of Si—B bondings. Accordingly, the finally-obtained SiOC film containing B can be a thin film having better quality.

(b) According to the film-forming sequence of the present embodiment, in Step 3c, the modifying action to the SiOC layer can be significantly improved by the plasma-excited BCl$_3$ gas. Thus, the modifying process of the SiOC layer can be sufficiently performed even under a low temperature condition of, e.g., 150 degrees C. or less. Accordingly, it is possible to further improve the thermal budget of the wafer 200.

(c) According to the film-forming sequence of the present embodiment, the temperature of the wafer 200 in Step 3c is set to be equal to the temperature of the wafer 200 in Steps 1c and 2c. Thus, when the cycle sequentially carrying out Steps 1c, 2c and 3c is performed a predetermined number of times, the respective steps can be performed without having to perform temperature adjustment during the cycle. Accordingly, it is possible to omit the time otherwise required in increasing or reducing the temperature of the wafer 200. This makes it possible to shorten the processing time per one cycle and to shorten the overall processing time.

(3) Modified Example of the Present Embodiment

Next, a modified example of the present embodiment will be described with reference to FIG. 9B. The present modified example differs from the aforementioned second embodiment in that, in the modifying process of the SiOC layer, the BCl$_3$ gas is not supplied to the wafer 200 in a plasma-excited state but supplied to the wafer 200 together with a pyridine gas as a catalytic gas.

The sequence of the present modified example differs from the film-forming sequence of the aforementioned second embodiment only in that the BCl$_3$ gas is supplied together with the pyridine gas. In other respects, the sequence of the present modified example remains the same as the film-forming sequence of the aforementioned second embodiment. Description will now be made on the procedures of supplying the BCl$_3$ gas and the pyridine gas in the present modified example.

(BCl$_3$ Gas+Pyridine Gas Supply)

After finishing the steps performed just like Steps 1c and 2c and removing the gases remaining within the process chamber 201, the valve 243d is opened to allow the BCl$_3$ gas to flow through the gas supply pipe 232d. The flow rate of the BCl$_3$ gas is regulated by the MFC 241d. The BCl$_3$ gas is supplied from the gas supply holes 250d into the buffer chamber 237 and from the gas supply holes 250e into the process chamber 201 and is exhausted from the exhaust pipe 231. In this way, the BCl$_3$ gas is supplied to the wafer 200 (BCl$_3$ gas supply). At the same time, the valve 243j is opened and an inert gas such as an N$_2$ gas or the like is allowed to flow through the gas supply pipe 232j. The flow rate of the N$_2$ gas is regulated by the MFC 241j. The N$_2$ gas is supplied into the process chamber 201 together with the BCl$_3$ gas and is exhausted from the exhaust pipe 231.

The valve 243c is opened to allow the pyridine gas to flow through the gas supply pipe 232c. The flow rate of the pyridine gas is regulated by the MFC 241c. The pyridine gas is supplied from the gas supply holes 250c into the process chamber 201 and is exhausted from the exhaust pipe 231. In this way, the pyridine gas is supplied to the wafer 200 (pyridine gas supply). At the same time, the valve 243i is opened and an inert gas such as an N$_2$ gas or the like is allowed to flow through the gas supply pipe 232i. The flow rate of the N$_2$ gas is regulated by the MFC 241i. The N$_2$ gas is supplied into the process chamber 201 together with the pyridine gas and is exhausted from the exhaust pipe 231.

When supplying the respective gases, as with the aforementioned embodiment, the N$_2$ gas supply is appropriately performed to prevent the gases from entering the nozzles 249a and 249b not in use at that time.

At this time, the APC valve 244 is appropriately adjusted such that the internal pressure of the process chamber 201 is kept, e.g., less than an atmospheric pressure, specifically in a range of 1 to 13330 Pa (0.0075 to 100 Torr), more specifically in a range of 133 to 2666 Pa (1 to 20 Torr), e.g., at 1333 Pa (10 Torr). The supply flow rate of the BCl$_3$ gas controlled by the MFC 241d is kept, e.g., in a range of 1 to 2000 sccm, specifically 10 to 1000 sccm. The supply flow rate of the pyridine gas controlled by the MFC 241c is kept, e.g., in a range of 1 to 2000 sccm, specifically 10 to 1000 sccm. The supply flow rates of the N$_2$ gas controlled by the MFCs 241g to 241j are respectively kept, e.g., in a range of 100 to 10000 sccm. The time duration required in supplying the BCl$_3$ gas and the pyridine gas to the wafer 200 is set, e.g., in a range of 1 to 100 seconds, specifically 5 to 60 seconds. The temperature of the heater 207 is set such that the temperature of the wafer 200 is kept in the same temperature range as the temperature of the wafer 200 in the steps performed just like Steps 1c and 2c, e.g., in a range of from a room temperature to 150 degrees C., specifically from a room temperature to 100 degrees C, more specifically from 50 degrees C. to 100 degrees C.

The pyridine gas is supplied to the wafer 200 together with the BCl$_3$ gas, thereby weakening the bonding force of the O—H bonding existing on the surface of the SiOC layer formed on the wafer 200. The H having a weakened bonding force and the Cl of the BCl$_3$ gas react with each other, whereby an HCl gas is generated and desorbed. The BCl$_3$ molecule which has lost Cl is chemically adsorbed to the surface of the SiOC layer. Thus, B is introduced into the SiOC layer. In this way, the pyridine gas promotes the decomposition of the BCl$_3$ gas, thereby enabling the BCl$_3$ gas to modify the SiOC layer under a low temperature condition. The SiOC layer is thermally modified under a non-plasma atmosphere and is converted to a third layer containing B, namely an SiOC layer containing B. At this time, at least some of the B introduced into the SiOC layer may form bondings with the component of the SiOC layer, e.g., form Si—B bondings with Si of the SiOC layer.

Thereafter, the valve 243d is closed to stop the supply of the BCl$_3$ gas and the valve 243c is closed to stop the supply of the pyridine gas.

By supplying the BCl$_3$ gas together with the pyridine gas to the wafer 200 in this manner, it is possible to activate the BCl$_3$ gas under a low temperature condition of, e.g., 150 degrees C. or less, to modify the SiOC layer. Since the temperature of the wafer 200 in the modifying process of the SiOC layer may be set to be equal to the temperature of the wafer 200 during the formation of the SiOC layer, it is possible to shorten the processing time per one cycle.

In the aforementioned second embodiment and the modified example thereof, the cycle that sequentially performs the steps of supplying the respective gases to the wafer 200 is performed a predetermined number of times. Alternatively, as with the aforementioned first embodiment, the set including the steps performed just like Steps 1a and 2a may be performed a predetermined number of times to initially form an SiOC layer on the wafer 200. Then, the $BCl_3$ gas may be plasma-excited, or the $BCl_3$ gas may be supplied to the wafer 200 together with the pyridine gas. In this way, the SiOC film may be modified to an SiOC film containing B.

In the case where the SiOC film is modified by supplying the $BCl_3$ gas to the wafer 200 together with the pyridine gas, the temperature of the wafer 200 may be set higher than the temperature of the wafer 200 during the formation of the SiOC film. More specifically, the temperature of the wafer 200 may be set, e.g., equal to the temperature of the wafer 200 during the SiOC film modifying process of the aforementioned first embodiment. If the temperature of the wafer 200 during the modification of the SiOC film is set substantially equal to the temperature of the wafer 200 during the formation of the SiOC film, there is a possibility that the modifying action of the $BCl_3$ gas may not affect the entire film while the effect of modifying at least the surface layer portion of the SiOC film is obtainable. By setting the temperature of the wafer 200 during the modification of the SiOC film higher than the temperature of the wafer 200 during the formation of the SiOC film, it is possible to enable the modifying action of the $BCl_3$ gas to uniformly affect substantially the entirety of the SiOC film. This makes it possible to obtain a thin film having a uniform quality. In addition, water is easily desorbed from the SiOC film and, therefore, B is readily introduced into the pores from which water is removed.

In the case where the SiOC film is modified by plasma-exciting the $BCl_3$ gas and supplying the plasma-excited $BCl_3$ gas to the wafer 200, the temperature of the wafer 200 may be set to be equal to, e.g., the temperature of the wafer 200 in the steps performed just like Steps 1a and 2a. Since the plasma-excited $BCl_3$ gas is in a highly activated state, it is possible to enable the modifying action of the $BCl_3$ gas to uniformly affect substantially the entirety of the SiOC film even under low temperature conditions. However, even if the plasma is used, the temperature of the wafer 200 may be set to be higher than the temperature of the wafer 200 in the steps performed just like Steps 1a and 2a. For example, the temperature of the wafer 200 may be set to be 500 degrees C. or less. By doing so, water is easily desorbed from the SiOC film and, therefore, B is readily introduced into the pores from which water is removed.

OTHER EMBODIMENTS

While certain embodiments of the present disclosure have been described in detail, the present disclosure is not limited to the embodiments and the modified examples described above but various modifications may be made without departing from the spirit of the present disclosure.

For example, in the aforementioned first embodiment, there has been described an example where the cycle in which the SiOC film modifying process is carried out by performing Steps 1a and 2a a predetermined number of times is performed only once. However, the cycle may be repeated a plurality of times. In the aforementioned second embodiment, there has been described an example where the cycle in which Steps 1c, 2c and 3c are sequentially performed once is carried out a predetermined number of times. However, for instance, a cycle in which Steps 1c and 2c are repeated a plurality of times and Step 3c is performed once, may be performed a predetermined number of times.

In the aforementioned embodiments, there has been described an example where the step of supplying the modifying gas is performed independently of the step of supplying the precursor gas or the oxidizing gas. However, the step of supplying the modifying gas may be performed during the step of supplying the precursor gas and the first catalytic gas. Moreover, the step of supplying the modifying gas may be performed during the step of supplying the oxidizing gas and the second catalytic gas.

In the aforementioned embodiments, there has been described an example where a haloborane-based gas or a borane-based gas is used as the modifying gas containing B as a Group III element. However, as the B-containing gas, it may be possible to use: an alkylborane-based gas such as a trimethylborane $[(CH_3)_3B]$ gas, a triethylborane $[(C_2H_5)_3B]$ gas, a trinormalprophylborane $[(n-C_3H_7)_3B]$ gas, a triisoprophylborane $[(i-C_3H_7)_3B]$ gas, a trinormalbutylborane $[(n-C_4H_9)_3B]$ gas, a triisobutylborane $[(i-C_4H_9)_3B]$ gas, a tritertiarybutylborane $[(t-C_4H_9)_3B]$ gas, a tertiarybutylborane $(t-C_4H_9BH_2)$ gas or the like; an aminoborane-based gas such as an aminoborane $(NH_2BH_2)$ gas, a tris(dimethylamino)borane $\{[(CH_3)_2N]_3B\}$ gas, a bis(dimethylamino)borane $\{BH[N(CH_3)_2]_2\}$ gas, a bis(dimethylamino)chloroborane $\{[(CH_3)_2N]_2BCl\}$ gas or the like; a borane amide-based gas such as a bis(dimethylamino)methylborane $\{CH_3B[N(CH_3)_2]_2\}$ gas, a dimethylaminodimethylborane $[(CH_3)_2BN(CH_3)_2]$ gas, a diethylaminodiethylborane $\{(C_2H_5)_2BN(C_2H_5)_2\}$ gas or the like; a alkoxyborane-based gas such as a trimethoxyborane $[B(OCH_3)_3]$ gas, a triethoxyborane $[B(OC_2H_5)_3]$ gas, a trinormalpropoxyborane $[B(n-OC_3H_7)_3]$ gas, a triisopropoxyborane $[B(i-OC_3H_7)_3]$ gas, a trinormalbutoxyborane $[B(n-OC_4H_9)_3]$ gas, a triisobutoxyborane $[B(i-OC_4H_9)_3]$ gas, a trisecondarybutoxyborane $[B(sec-OC_4H_9)_3]$ gas or the like; a boron oxychloride $(BOCl_3)$ gas; a trivinylborane $[(CH_2=CH)_3B]$ gas; and so forth. In addition, an SiOC film containing In as a specified element may be formed using an In-containing gas in which B of the B-containing gases is substituted by In as a Group III element.

In the aforementioned embodiments, there has been described an example where a phosphine-based gas or a halophosphine-based gas is used as the modifying gas containing P as a Group V element. However, as the P-containing gas, it may be possible to use: an alkylphosphine-based gas such as a trimethylphosphine $[(CH_3)_3P]$ gas, a triethylphosphine $[(C_2H_5)_3P]$ gas, a trinormalpropylphosphine $[(n-C_3H_7)_3P]$ gas, a triisopropylphosphine $[(i-C_3H_7)_3P]$ gas, a trinormalbutylphosphine $[(n-C_4H_9)_3P]$ gas, a triisobutylphosphine $[(i-C_4H_9)_3P]$ gas, a tritertiarybutylphosphine $[(t-C_4H_9)_3P]$ gas, a tertiarybutylphosphine $(t-C_4H_9PH_2)$ gas or the like; an aminophosphine-based gas such as an aminophosphine $(NH_2PH_2)$ gas, a tris(dimethylamino)phosphine $\{[(CH_3)_2N]_3P\}$ gas, a bis(dimethylamino)phosphine $\{PH[N(CH_3)_2]_2\}$ gas, a bis(dimethylamino)chlorophosphine $\{[(CH_3)_2N]_2PCl\}$ gas or the like; a phosphinous amide-based gas such as a bis(dimethylamino)methylphosphine $\{CH_3P[N(CH_3)_2]_2\}$ gas, a dimethylaminodimethylphosphin $[(CH_3)_2PN(CH_3)_2]$ gas, a diethylaminodiethylphosphine $[(C_2H_5)_2PN(C_2H_5)_2]$ gas or the like; an alkoxyphosphine-based gas such as a trimethoxyphosphine $[P(OCH_3)_3]$ gas, a triethoxyphosphine $[P(OC_2H_5)_3]$ gas, a trinormalpropoxyphosphine $[P(n-OC_3H_7)_3]$ gas, a triisopropoxyphosphine $[P(i-OC_3H_7)_3]$ gas, a trinormalbutoxyphosphine $[P(n-OC_4H_9)_3]$ gas, a triisobutoxyphosphine $[P(i-$ OC$_4$H$_9$)$_3$] gas, a trisecondarybutoxyphosphine [P(sec-OC$_4$H$_9$)$_3$] gas or the like; a phosphate ester-based gas such as a trimethylphospinate [PO(OCH$_3$)$_3$] gas, a triethylphosphinate [PO(OC$_2$H$_5$)$_3$] gas, a trinormalpropylphosphinate [PO(n-OC$_3$H$_7$)$_3$] gas, a triisopropylphosphinate [PO(i-OC$_3$H$_7$)$_3$] gas, a trinormalbutylphosphinate [PO(n-OC$_4$H$_9$)$_3$] gas, a triisobutylphosphinate [PO(i-OC$_4$H$_9$)$_3$] gas or the like; a phosphorus oxychloride (POCl$_3$) gas; a trivinylphosphine [(CH$_2$=CH)$_3$P] gas; and so forth. In addition, an SiOC film containing As as a specified element may be formed using an As-containing gas in which P of the P-containing gases is substituted by As as a Group V element.

In the aforementioned second embodiment, there has been described an example where, in the case of plasma-exciting the BCl$_3$ gas as the modifying gas and supplying the BCl$_3$ gas to the wafer 200, the BCl$_3$ gas is supplied into the process chamber 201 together with the Ar gas through the buffer chamber 237 using the same nozzle 249$d$ as the nozzle through which the Ar gas as the assist gas is supplied. However, the BCl$_3$ gas may be supplied from a nozzle, which is installed outside the buffer chamber 237 independently of the nozzle 249$d$ for supplying the Ar gas, into the process chamber 201 without going through the buffer chamber 237. Even in this case, the BCl$_3$ gas supplied into the process chamber 201 can be plasma-excited with assistance from the Ar gas supplied from the gas supply holes 250$e$ into the process chamber 201 in a plasma state.

In the aforementioned second embodiment, there has been described an example where, in the case of plasma-exciting the BCl$_3$ gas and supplying the BCl$_3$ gas to the wafer 200, the BCl$_3$ gas is supplied together with the Ar gas as the assist gas. However, the assist gas may not be used in the case where the BCl$_3$ gas is supplied through the buffer chamber 237. In this case, the BCl$_3$ gas in a plasma state can be stably obtained by regulating the internal pressure of the process chamber 201 or the buffer chamber 237 and the radio-frequency power applied between the rod-shaped electrodes 269 and 270 during the supply of the BCl$_3$ gas.

In the aforementioned embodiments, there has been described an example where, in Steps 2$a$, 2$b$ and 2$c$, the Si-containing layer containing C and Cl is oxidized and converted to an SiOC layer using an oxidizing gas such as an H$_2$O gas or the like together with a catalytic gas. However, the Si-containing layer containing C and Cl may be oxidized and converted to an SiOC layer using an oxidizing gas such as a plasma-excited O$_2$ gas or the like.

In the aforementioned embodiments, there has been described an example where the SiOC film containing a specified element such as B or the like is formed as a thin film. However, it may be possible to form a multi-layered film by laminating this thin film and a thin film differing in composition and elements from this thin film.

In this case, for example, a multi-layered film, which includes a first thin film containing Si, O, C and a specified Group III or Group V element and a second thin film containing at least Si and O, is formed on the wafer 200 by performing a cycle a predetermined number of times. The cycle includes: a process in which the first thin film is formed by performing, a predetermined number of times, a set including a step of supplying a precursor gas containing Si, C and a halogen element and having an Si—C bonding and a first catalytic gas to a wafer 200, a step of supplying an oxidizing gas and a second catalytic gas to the wafer 200 and a step of supplying a modifying gas containing the specified Group III or Group V element to the wafer 200 (Set 1); and a process in which the second thin film is formed by performing, a predetermined number of times, a set including a step of supplying a precursor gas containing at least Si and a halogen element and a third catalytic gas to the wafer 200 and a step of supplying an oxidizing gas and a fourth catalytic gas to the wafer 200 (Set 2).

At this time, the respective gases described above as examples in the aforementioned embodiments can be used as the oxidizing gas, the catalytic gas and the modifying gas. In the steps of supplying the respective gases including the precursor gas, it is possible to use the conditions used in the corresponding steps of the aforementioned embodiments and the modified examples thereof.

In Set 1, as described above, an SiOC film containing a specified element such as B or the like can be formed as the first thin film. At this time, as the precursor gas containing Si, C and a halogen element and having an Si—C bonding, it is possible to use, e.g., the BTCSM gas, the BTCSE gas, the TCDMDS gas, the DCTMDS gas and the MCPMDS gas, which are mentioned earlier.

In Set 2, for example, a silicon oxide film (an SiO$_2$ film which will be also referred to as an SiO film herein below) can be formed as the second thin film. At this time, as the precursor gas containing at least Si and a halogen element, it is possible to use, e.g., a hexachlorodisilane (Si$_2$Cl$_6$, abbreviation: HCDS) gas, a trichlorosilane (SiHCl$_3$, abbreviation: TCS) gas, a silicon tetrachloride (SiCl$_4$, abbreviation: STC) gas, a dichlorosilane (SiH$_2$Cl$_2$, abbreviation: DCS) gas, a monochlorosilane (SiH$_3$Cl, abbreviation: MCS) gas, and the like. If a multi-layered film of two films differing in etching resistance, dielectric constant and ashing resistance from each other, namely a multi-layered film including an SiOC film containing the specified element and an SiO film, is formed in this manner, it is possible to further enhance the controllability of all the aforementioned properties of the multi-layered film.

In Set 2, for example, an SiOC film can be formed as the second thin film. At this time, as the precursor gas containing at least Si and a halogen element, it is possible to use, e.g., the BTCSM gas, the BTCSE gas, the TCDMDS gas, the DCTMDS gas and the MCPMDS gas, which are mentioned earlier. If a multi-layered film of two films differing in ashing resistance from each other, namely a multi-layered film including an SiOC film containing the specified element and an SiOC film not containing the specified element, is formed in this manner, it is possible to further enhance the controllability of the ashing resistance of the multi-layered film.

In Set 2, for example, an SiOCN film obtained by further adding nitrogen (N) to the SiOC film can be formed as the second thin film. In this case, it is only necessary that Set 2 further includes a step of supplying a nitriding gas (nitrogen-containing gas) to the wafer 200. As the nitriding gas, it is possible to use, e.g., an ammonia (NH$_3$) gas, a diazene (N$_2$H$_2$) gas, a hydrazine (N$_2$H$_4$) gas, an N$_3$H$_8$ gas and a gas containing these compounds. If a multi-layered film of two films, both films having a high ashing resistance, namely a multi-layered film including an SiOC film containing the specified element and an SiOCN film, is formed in this manner, it is possible to further increase the ashing resistance of the multi-layered film.

By performing the cycle including Sets 1 and 2 once, it is possible to form a multi-layered film (a stacked film) obtained by laminating a single first thin film and a single second thin film. By performing the cycle including Sets 1 and 2 a plurality of times, it is possible to form a multi-layered film (a laminated film) obtained by laminating a plurality of first thin films and a plurality of second thin films.

Along with the miniaturization of a transistor, there is an increasing demand for a low film forming temperature, a low dielectric constant and a low WER in a thin film such as an oxide film or the like which constitutes a sidewall spacer (SWS) used as a peripheral structure in a gate electrode. When manufacturing an RRAM (registered trademark) or an MRAM developed as a next generation memory, a process is performed by using a thin film surrounding the memory device as a protective film such as an etching stopper or the like. In the thin film formed after this process, there is a demand for a low film forming temperature, e.g., 350 degrees C. or less in the case of RRAM and 250 degrees C. or less in the case of MRAM. According to the present disclosure, a thin film which has a low dielectric constant and a low WER and which maintains these properties even after ashing can be formed under a low temperature condition. It is therefore possible to appropriately apply the present disclosure to the aforementioned demand.

If the Si-based thin films formed by the methods of the aforementioned embodiments and the modified examples thereof are used as sidewall spacers, it is possible to provide a technology of manufacturing a device which is low in leak current and superior in workability.

If the Si-based thin films formed by the methods of the aforementioned embodiments and the modified examples thereof are used as etching stoppers, it is possible to provide a technology of manufacturing a device which is superior in workability.

According to the respective embodiments and the modified examples thereof, excluding the aforementioned second embodiment and the modified examples thereof, it is possible to form a Si-based thin film having an ideal stoichiometric ratio without using plasma. Since the Si-based thin film can be formed without using plasma, the present disclosure can be applied to a process for the formation of, e.g., an SADP film of DPT, in which plasma damage is concerned.

In some embodiments, the process recipes used in the formation of different types of thin films (the programs defining the processing sequences and the processing conditions) are individually prepared (in a plural number) depending on the substrate processing contents (e.g., the type, composition ratio, quality and thickness of the thin film to be formed). In some embodiments, when starting the substrate processing, a suitable process recipe is appropriately selected from the plurality of process recipes depending on the substrate processing contents. More specifically, the process recipes individually prepared depending on the substrate processing contents may be stored (installed) in advance within the memory device 121c of the substrate processing apparatus by way of an electric communication line or a recording medium (the external memory device 123) on which the process recipes are recorded. In some embodiments, when starting the substrate processing, the CPU 121a of the substrate processing apparatus appropriately selects a suitable process recipe from the plurality of process recipes stored in the memory device 121c depending on the substrate processing contents. With this configuration, thin films of different types, composition ratios, qualities and thicknesses can be formed by one substrate processing apparatus with increased versatility and reproducibility. It is also possible to alleviate the operation burden (such as the input burden of processing sequences and processing conditions) borne by an operator. This makes it possible to rapidly start the substrate processing while avoiding an operational error.

The process recipes mentioned above are not limited to the newly prepared ones but may be prepared by, e.g., changing the existing process recipes which have already been installed in the substrate processing apparatus. In the case of changing the existing process recipes, the changed process recipes may be installed in the substrate processing apparatus by way of an electric communication line or a recording medium on which the changed process recipes are recorded. The existing process recipes which have already been installed in the substrate processing apparatus may be directly changed by operating the input/output device 122 of the existing substrate processing apparatus.

In the film-forming sequences of the aforementioned embodiments, there has also been described an example where the SiOC film, the SiOC film containing a specified element such as B or the like, and the multi-layered film are formed at a room temperature. In this case, it is not necessary to heat the interior of the process chamber 201 using the heater 207. Thus, the substrate processing apparatus may not be provided with a heater. This makes it possible to simplify the configuration of the heating system of the substrate processing apparatus, thereby making the substrate processing apparatus cheap and simple in structure. In this case, when performing the modifying process of the SiOC film or the like at a high temperature, the modifying process may be performed ex-situ in a process chamber differing from the process chamber in which the forming process of the SiOC film or the like is performed.

In the aforementioned embodiments, there has been described an example where thin films are formed using a batch type substrate processing apparatus that processes a plurality of substrates all at once. However, the present disclosure is not limited thereto but may be appropriately applied to a case where a thin film is formed using a single-substrate-type substrate processing apparatus that processes one substrate or several substrates all at once. In the aforementioned embodiments, there has been described an example where a thin film is formed using a substrate processing apparatus provided with a hot-wall-type processing furnace. However, the present disclosure is not limited thereto but may be appropriately applied to a case where a thin film is formed using a substrate processing apparatus provided with a cold-wall-type processing furnace.

The respective embodiments and the respective modified examples described above may be appropriately combined.

Preferred Aspects of the Present Disclosure

Some preferred aspects of the present disclosure will now be supplementarily stated.

(Supplementary Note 1)

According to one aspect of the present disclosure, there is provided a semiconductor device manufacturing method, including: forming a thin film containing silicon, oxygen, carbon and a specified Group III or Group V element on a substrate by performing a cycle a predetermined number of times, the cycle including: supplying a precursor gas containing silicon, carbon and a halogen element and having an Si—C bonding and a first catalytic gas to the substrate; supplying an oxidizing gas and a second catalytic gas to the substrate; and supplying a modifying gas containing the specified Group III or Group V element to the substrate.

(Supplementary Note 2)

In the method of Supplementary Note 1, the cycle includes: forming a first thin film containing silicon, oxygen and carbon on the substrate by performing a set a predetermined number of times, the set including: supplying the precursor gas and the first catalytic gas; and supplying the oxidizing gas and the second catalytic gas; and modifying the first thin film into a second thin film further containing the specified Group III or Group V element in addition to silicon, oxygen, and carbon by supplying the modifying gas.

(Supplementary Note 3)

In the method of Supplementary Note 2, formation of the first thin film and modification of the first thin film may be performed in a state where the substrate is accommodated within the same process chamber.

(Supplementary Note 4)

In the method of Supplementary Note 2, formation of the first thin film and modification of the first thin film may be performed in a state where the substrate is accommodated within different process chambers, respectively.

(Supplementary Note 5)

In the method of Supplementary Note 1, the cycle may include sequentially performing supplying the precursor gas and the first catalytic gas, supplying the oxidizing gas and the second catalytic gas, and supplying the modifying gas.

(Supplementary Note 6)

In the method of any one of Supplementary Notes 1 to 5, in supplying the precursor gas and the first catalytic gas and supplying the oxidizing gas and the second catalytic gas, the substrate may be set at a temperature equal to or higher than a room temperature and equal to or lower than 150 degrees C. In some embodiments, the substrate may be set at a temperature equal to or higher than a room temperature and equal to or lower than 100 degrees C. In some embodiments, the substrate may be set at a temperature equal to or higher than 50 degrees C. and equal to or lower than 100 degrees C.

(Supplementary Note 7)

In the method of any one of Supplementary Notes 1 to 6, in supplying the modifying gas, the substrate may be set at a temperature equal to or higher than a room temperature and equal to or lower than 500 degrees C.

(Supplementary Note 8)

In the method of any one of Supplementary Notes 1 to 7, in supplying the modifying gas, the substrate may be set at a temperature equal to a temperature of the substrate used in supplying the precursor gas and the first catalytic gas and supplying the oxidizing gas and the second catalytic gas.

(Supplementary Note 9)

In the method of any one of Supplementary Notes 1 to 6, in supplying the modifying gas, the substrate may be set at a temperature equal to or higher than 200 degrees C. and equal to or lower than 900 degrees C. In some embodiments, the substrate may be set at a temperature equal to or higher than 200 degrees C. and equal to or lower than 700 degrees C. In some embodiments, the substrate may be set at a temperature equal to or higher than 200 degrees C. and equal to or lower than 600 degrees C.

(Supplementary Note 10)

In the method of any one of Supplementary Notes 1 to 9, supplying the precursor gas and the first catalytic gas, supplying the oxidizing gas and the second catalytic gas, and supplying the modifying gas may be performed under a non-plasma atmosphere.

(Supplementary Note 11)

In the method of any one of Supplementary Notes 1 to 8, in supplying the modifying gas, the modifying gas may be supplied to the substrate in a plasma-excited state.

(Supplementary Note 12)

In the method of any one of Supplementary Notes 1 to 10, in supplying the modifying gas, the modifying gas may be supplied to the substrate together with a third catalytic gas.

(Supplementary Note 13)

In the method of any one of Supplementary Notes 1 to 12, the precursor gas may contain at least one selected from the group consisting of an alkyl group and an alkylene group.

(Supplementary Note 14)

In the method of Supplementary Note 13, the precursor gas containing the alkylene group may have at least one selected from the group consisting of an Si—C—Si bonding and an Si—C—C—Si bonding.

(Supplementary Note 15)

In the method of any one of Supplementary Notes 1 to 14, the precursor gas may contain at least one selected from the group consisting of an alkyl group containing a carbon forming an Si—C bonding and an alkylene group containing a carbon forming an Si—C bonding.

(Supplementary Note 16)

In the method of Supplementary Note 15, the precursor gas containing the alkylene group may have at least one selected from the group consisting of an Si—C—Si bonding including the Si—C bonding in a portion thereof and an Si—C—C—Si bonding including the Si—C bonding in a portion thereof.

(Supplementary Note 17)

In the method of any one of Supplementary Notes 1 to 16, the first to third catalytic gases may include an amine-based catalytic gas.

(Supplementary Note 18)

In the method of any one of Supplementary Notes 1 to 17, the modifying gas may contain B or In as the Group III element or contain P or As as the Group V element.

(Supplementary Note 19)

In the method of any one of Supplementary Notes 1 to 18, the modifying gas may include at least one selected from the group consisting of a boron-containing gas and an indium-containing gas or at least one selected from the group consisting of a phosphorus-containing gas and an arsenic-containing gas.

(Supplementary Note 20)

According to another aspect of the present disclosure, there is provided a substrate processing method, including: forming a thin film containing silicon, oxygen, carbon and a specified Group III or Group V element on a substrate by performing a cycle a predetermined number of times, the cycle including: supplying a precursor gas containing silicon, carbon and a halogen element and having an Si—C bonding and a first catalytic gas to the substrate; supplying an oxidizing gas and a second catalytic gas to the substrate; and supplying a modifying gas containing the specified Group III or Group V element to the substrate.

(Supplementary Note 21)

According to still another aspect of the present disclosure, there is provided a substrate processing apparatus, including: a process chamber configured to accommodate therein a substrate; a precursor gas supply system configured to supply a precursor gas containing silicon, carbon and a halogen element and having an Si—C bonding into the process chamber; an oxidizing gas supply system configured to supply an oxidizing gas into the process chamber; a catalytic gas supply system configured to supply first and second catalytic gases into the process chamber; a modifying gas supply system configured to supply a modifying gas containing a specified Group III or Group V element into the process chamber; and a control unit configured to control the precursor gas supply system, the oxidizing gas supply system, the catalytic gas supply system and the modifying gas supply system such that a process of forming a thin film containing silicon, oxygen, carbon and the specified Group III or Group V element on a substrate is carried out by performing a cycle a predetermined number of times, the cycle including: supplying the precursor gas and the first catalytic gas to the substrate accommodated within the process chamber; supplying the oxidizing gas and the second catalytic gas to the substrate accommodated within the process chamber; and supplying the modifying gas to the substrate.

(Supplementary Note 22)

According to still further aspect of the present disclosure, there is provided a substrate processing system including a first substrate processing apparatus configured to form a first thin film containing silicon, oxygen, and carbon on a substrate and a second substrate processing apparatus configured to modify the first thin film to a second thin film further containing a specified Group III or Group V element in addition to silicon, oxygen, and carbon, wherein the first substrate processing apparatus includes: a first process chamber configured to accommodate therein the substrate; a precursor gas supply system configured to supply a precursor gas containing silicon, carbon and a halogen element and having an Si—C bonding into the first process chamber; an oxidizing gas supply system configured to supply an oxidizing gas into the first process chamber; a catalytic gas supply system configured to supply first and second catalytic gases into the first process chamber; and a first control unit configured to control the precursor gas supply system, the oxidizing gas supply system and the catalytic gas supply system such that a process of forming the first thin film on the substrate is carried out by performing a cycle a predetermined number of times, the cycle including: supplying the precursor gas and the first catalytic gas to the substrate accommodated within the first process chamber and supplying the oxidizing gas and the second catalytic gas to the substrate accommodated within the first process chamber, and wherein the second substrate processing apparatus includes: a second process chamber configured to accommodate therein the substrate; a modifying gas supply system configured to supply a modifying gas containing the specified Group III or Group V element into the second process chamber; and a second control unit configured to control the modifying gas supply system such that a process of modifying the first thin film to the second thin film is carried out by performing supplying the modifying gas to the substrate.

(Supplementary Note 23)

According to still further aspect of the present disclosure, there are provided a program that causes a computer to perform a process of forming a thin film containing silicon, oxygen, carbon and a specified Group III or Group V element on a substrate by performing a cycle a predetermined number of times, the cycle including: supplying a precursor gas containing silicon, carbon and a halogen element and having an Si—C bonding and a first catalytic gas to the substrate accommodated within the process chamber; supplying an oxidizing gas and a second catalytic gas to the substrate accommodated within the process chamber; and supplying a modifying gas containing the specified Group III or Group V element to the substrate, and a non-transitory computer-readable recording medium storing the program.

According to the present disclosure, it is possible to form a thin film having superior ashing resistance while maintaining high etching resistance.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device manufacturing method, comprising:
    forming a thin film containing silicon, oxygen, carbon and a specified Group III or Group V element on a substrate by performing a cycle a predetermined number of times, the cycle comprising:
    supplying a precursor gas containing silicon, carbon and a halogen element and having an Si—C bonding and a first catalytic gas to the substrate;
    supplying an oxidizing gas and a second catalytic gas to the substrate; and
    supplying a modifying gas containing the specified Group III or Group V element to the substrate.

2. The method of claim 1, wherein the cycle comprises sequentially performing supplying the precursor gas and the first catalytic gas, supplying the oxidizing gas and the second catalytic gas, and supplying the modifying gas.

3. The method of claim 1, wherein, in supplying the precursor gas and the first catalytic gas and supplying the oxidizing gas and the second catalytic gas, the substrate is set at a temperature equal to or higher than a room temperature and equal to or lower than 150 degrees C.

4. The method of claim 1, wherein, in supplying the modifying gas, the substrate is set at a temperature equal to or higher than a room temperature and equal to or lower than 500 degrees C.

5. The method of claim 1, wherein, in supplying the modifying gas, the substrate is set at a temperature equal to a temperature of the substrate in supplying the precursor gas and the first catalytic gas and supplying the oxidizing gas and the second catalytic gas.

6. The method of claim 1, wherein, in supplying the modifying gas, the substrate is set at a temperature equal to or higher than 200 degrees C. and equal to or lower than 900 degrees C.

7. The method of claim 1, wherein supplying the precursor gas and the first catalytic gas, supplying the oxidizing gas and the second catalytic gas, and supplying the modifying gas are performed under a non-plasma atmosphere.

8. The method of claim 1, wherein, in supplying the modifying gas, the modifying gas is supplied to the substrate in a plasma-excited state.

9. The method of claim 1, wherein, in supplying the modifying gas, the modifying gas is supplied to the substrate together with a third catalytic gas.

10. The method of claim 1, wherein the precursor gas contains at least one selected from the group consisting of an alkyl group and an alkylene group.

11. The method of claim 1, wherein the Si—C bonding of the precursor gas is a portion of at least one selected from the group consisting of an Si—C—Si bonding and an Si—C—C—Si bonding.

12. The method of claim 1, wherein each of the first and second catalytic gases comprises an amine-based catalytic gas.

13. The method of claim 1, wherein the modifying gas contains B or In as the Group III element or contains P or As as the Group V element.

14. The method of claim 1, wherein the modifying gas comprises at least one selected from the group consisting of a boron-containing gas and an indium-containing gas or at least one selected from the group consisting of a phosphorus-containing gas and an arsenic-containing gas.

15. A semiconductor device manufacturing method, comprising:
   forming a thin film containing silicon, oxygen, carbon and a specified Group III or Group V element on a substrate by performing a cycle a predetermined number of times, the cycle comprising:
   forming a first thin film containing silicon, oxygen and carbon on the substrate by performing a set a predetermined number of times, the set including:
   supplying a precursor gas containing silicon, carbon and a halogen element and having an Si—C bonding: and a first catalytic gas to the substrate; and
   supplying an oxidizing gas and a second catalytic gas to the substrate; and
   modifying the first thin film into a second thin film further containing the specified Group III or Group V element in addition to silicon, oxygen and carbon by supplying a modifying gas containing the specified Group III or Group V element to the substrate.

16. The method of claim 15, wherein formation of the first thin film and modification of the first thin film are performed in a state where the substrate is accommodated within the same process chamber.

17. The method of claim 15, wherein formation of the first thin film and modification of the first thin film are performed in a state where the substrate is accommodated within different process chambers, respectively.

* * * * *